(12) United States Patent
Huang et al.

(10) Patent No.: US 12,159,870 B2
(45) Date of Patent: Dec. 3, 2024

(54) SEMICONDUCTOR STRUCTURE AND FORMING METHOD THEREOF

(71) Applicant: TAIWAN SEMICONDUCTOR MANUFACTURING COMPANY LTD., Hsinchu (TW)

(72) Inventors: Hung-Shu Huang, Taichung (TW); Jhih-Bin Chen, Hsinchu (TW); Ming Chyi Liu, Hsinchu (TW); Yu-Chang Jong, Hsinchu (TW); Chien-Chih Chou, New Taipei (TW); Jhu-Min Song, Nantou County (TW); Yi-Kai Ciou, Taoyuan (TW); Tsung-Chieh Tsai, Hsin-Chu County (TW); Yu-Lun Lu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 352 days.

(21) Appl. No.: 17/587,342

(22) Filed: Jan. 28, 2022

(65) Prior Publication Data

US 2023/0246030 A1 Aug. 3, 2023

(51) Int. Cl.
*H01L 27/092* (2006.01)
*H01L 21/8238* (2006.01)
*H01L 29/40* (2006.01)
*H01L 29/423* (2006.01)

(52) U.S. Cl.
CPC .. *H01L 27/0922* (2013.01); *H01L 21/823871* (2013.01); *H01L 21/823878* (2013.01); *H01L 29/401* (2013.01); *H01L 29/4236* (2013.01); *H01L 29/42364* (2013.01)

(58) Field of Classification Search
CPC ......... H01L 27/0922; H01L 21/823871; H01L 21/823878; H01L 29/401; H01L 29/4236; H01L 29/42364; H01L 21/761; H01L 21/76224; H01L 29/0653; H01L 29/165; H01L 29/66545; H01L 29/66621; H01L 29/66636; H01L 29/66659; H01L 29/78; H01L 29/7834; H01L 29/7848; H01L 21/823456; H01L 27/088; H01L 21/823462; H01L 21/823481
See application file for complete search history.

(56) References Cited

U.S. PATENT DOCUMENTS

2019/0067282 A1* 2/2019 Chen .................. H01L 29/1054
2020/0381442 A1* 12/2020 Wu ....................... H10B 41/49
2021/0265344 A1 8/2021 Chen et al.

\* cited by examiner

*Primary Examiner* — Karen Kusumakar
*Assistant Examiner* — Adam S Bowen
(74) *Attorney, Agent, or Firm* — WPAT LAW; Anthony King

(57) ABSTRACT

A semiconductor structure and forming method thereof are provided. A substrate includes a first region, a second region, and a boundary region defined between the first region and the second region. An isolation structure is disposed in the boundary region. An upper surface of the isolation structure has a stepped profile. A first boundary dielectric layer and a second boundary dielectric layer are disposed over the isolation structure. The first boundary dielectric layer is substantially conformal with respect to the stepped profile of the isolation structure.

20 Claims, 31 Drawing Sheets

SEMICONDUCTOR STRUCTURE AND FORMING METHOD THEREOF

BACKGROUND

The semiconductor integrated circuit (IC) industry has experienced exponential growth over the last few decades. As a result of IC evolution, high-voltage technology has been widely used in power management, regulators, battery protectors, DC motors, automotive products, panel display drivers (STN, TFT, OLED, etc.), color display drivers, power supply products and telecommunications, among others. Meanwhile, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been replacement of a polysilicon gate electrode of a logic core with a metal gate electrode and a high-k dielectric, also known as an HKMG replacement gate device, to improve performance of devices having the decreased feature sizes. High-voltage devices are integrated on a same chip with an HKMG logic core, and support the logic core to accomplish an intended function and limit or eliminate inter-chip communication.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
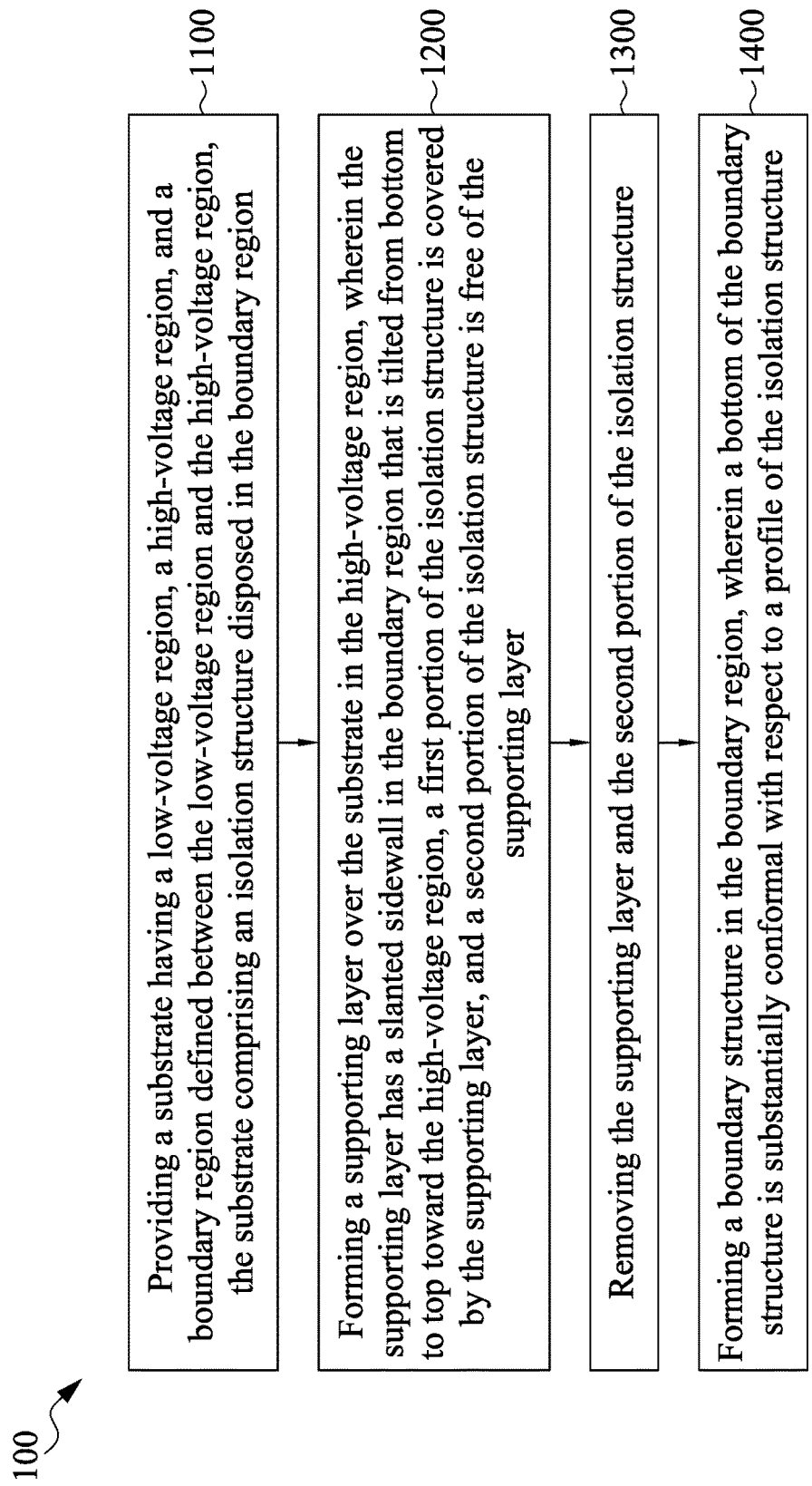
FIG. 1 is a flowchart representing a method for forming a semiconductor structure according to aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

High-k metal gate (HKMG) technology has become a leading candidate for a next generation of CMOS devices. HKMG technology incorporates a high-k dielectric to increase transistor capacitance and reduce gate leakage. A metal gate electrode is used to help with Fermi-level pinning and to allow the gate to be adjusted to low threshold voltages. By combining the metal gate electrode and the high-k dielectric, HKMG technology makes further scaling possible and allows integrated chips to function with reduced power. However, there are challenges to embedding HKMG devices and high-voltage devices, especially in 28 nm node and beyond processes. A problem associated with such integrated circuits is presence of boundary defects between a high-voltage region where the high-voltage devices reside and a low-voltage device region where devices operate at relatively lower voltages. For example, gate dielectrics for the high-voltage region and the low-voltage region often require different thickness and thus may need to be processed separately. Comparatively high isolation damage and toxic material residues may be introduced due to the gate dielectric's patterning and removal. Accordingly, an alternative approach to forming a semiconductor structure that includes a boundary structure disposed in a boundary region between a low-voltage region and a high-voltage region is therefore of primary importance.

Some embodiments of the present disclosure provide a semiconductor structure and a forming method thereof that provides one or more improvements over existing approaches. The present disclosure relates to a semiconductor structure that includes a boundary structure disposed in a boundary region between a low-voltage region and a high-voltage region and a forming method thereof. By forming the boundary structure within the boundary region as introduced below, residue contamination and isolation damage may be reduced. In addition, the disclosed boundary structure provides structural support during fabrications, such that a dishing effect is reduced or eliminated. Thereby, a device performance may be improved.

FIG. 1 is a flowchart representing a method 100 for forming a semiconductor structure according to aspects of one or more embodiments of the present disclosure. The method 100 for forming the semiconductor structure includes an operation 1100, in which a substrate is provided. In some embodiments, the substrate has a low-voltage region, a high-voltage region, and a boundary region defined between the low-voltage region and the high-voltage region. In some embodiments, the substrate includes an isolation structure disposed in the boundary region. The method 100 further includes an operation 1200, in which a supporting layer is formed over the substrate in the high-voltage region. In some embodiments, the supporting layer has a slanted sidewall in the boundary region that is tilted from bottom to top toward the high-voltage region. In some embodiments, a first portion of the isolation structure is covered by the supporting layer and a second portion of the isolation structure is free of the supporting layer. The method 100 further includes an operation 1300, in which the supporting layer and the second portion of the isolation structure are removed. The method 100 further includes an operation 1400, in which a boundary structure is formed in the boundary region. In some embodiments, the boundary structure is substantially conformal with respect to a profile of the isolation structure.

The method is described for a purpose of illustrating concepts of the present disclosure and the description is not intended to limit the present disclosure beyond what is explicitly recited in the claims. Additional operations can be provided before, during, and after the method described above and illustrated in FIG. 1, and some operations described can be replaced, eliminated, or rearranged for additional embodiments of the method.

FIGS. 2 to 31 are cross-sectional views illustrating a semiconductor structure 200 at different fabrication stages constructed according to aspects of one or more embodiments of the present disclosure.

Figure 2:
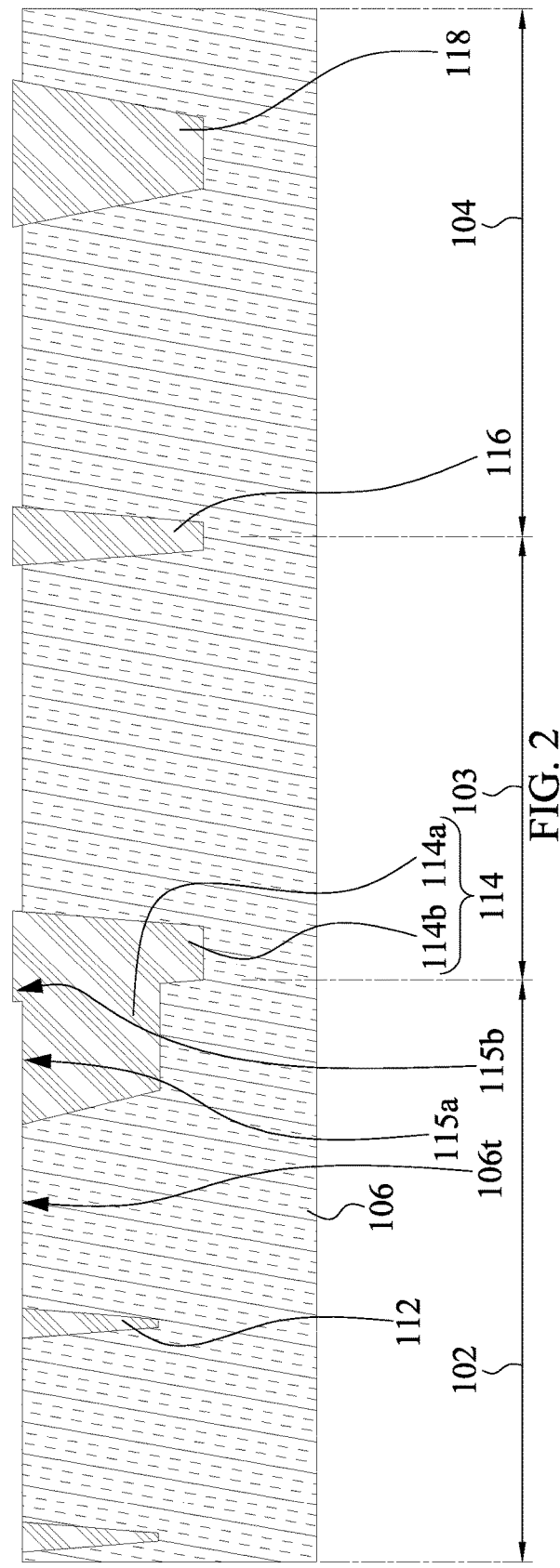
FIGS. 2 to 31 are cross-sectional views illustrating a semiconductor structure at different fabrication stages constructed according to aspects of one or more embodiments of the present disclosure.

Referring to FIG. 2, in some embodiments, a substrate 106 is provided. The respective step is shown as operation 1100 of the method 100 in FIG. 1. The substrate may include a first region 102, a second region 103, and a third region 104. The first region 102, the second region 103, and the third region 104 may be configured as a low-voltage region 102, a medium-voltage region 103, and a high-voltage region 104, respectively. In various embodiments, the substrate 106 may include any type of semiconductor body (e.g., silicon/CMOS bulk, SiGe, SOI, etc.) such as a semiconductor wafer or one or more dies on a wafer, as well as any other type of semiconductor material.

In some embodiments, isolation structures 112, 114, 116 and 118 may be formed within the substrate 106. The isolation structures 112, 114, 116 and 118 may be formed by selectively etching the substrate 106 to form a trench defined by sidewalls of the substrate 106. The trench is subsequently filled with one or more dielectric materials, such as, for example, silicon dioxide, forming the isolation structures 112, 114, 116 and 118. The isolation structures 112, 114, 116 and 118 may be shallow trench isolation (STI) structures or deep trench isolation (DTI) structures. The isolation structures 112, 114, 116 and 118 formed in different regions may have different dimensions. For example, a depth of the isolation structure 112 formed in the first region 102 is less than a depth of the isolation structure 116 formed between the second region 103 and the third region 104. In some embodiments, a depth of the isolation structure 116 is substantially equal to a depth of the isolation structure 118. In some embodiments, the depth of the isolation structure 112 is substantially equal to 2500 angstroms (Å) or in a range of about 2200 Å to about 2800 Å. In some embodiments, the depth of the isolation structure 116 is substantially equal to 3000 Å or in a range of about 2800 Å to about 3200 Å.

The isolation structures 116 and 118 may protrude from the substrate 106 and may have upper surfaces at positions higher than an upper surface 106t of the substrate 106. The isolation structure 114 formed between the first region 102 and the second region 103 (or between the first region 102 and the third region 104) may have a first portion 114a in the first region 102 and a second portion 114b in the second region 103 (or in the third region 104). A dimension of the first portion 114a may be different from a dimension of the second portion 114b. For example, a depth of the first portion 114a is less than a depth of the second portion 114b. In some embodiments, a depth of the first portion 114a is substantially equal to 2500 Å or in a range of about 2200 Å to about 2800 Å, and a depth of the second portion 114b is substantially equal to 3000 Å or in a range of about 2800 Å to about 3200 Å. In addition, the second portion 114b of the isolation structure 114 may protrude from the substrate 106 and may have an upper surface 115b at a position higher than the upper surface 106t of the substrate 106. In some embodiments, an upper surface 115a of the first portion 114a may be aligned with the upper surface 106t, while the upper surface 115b of the second portion 114b is higher than the upper surface 106t. In alternative embodiments, the upper surface 115a of the first portion 114a is aligned with the upper surface 115b of the second portion 114b.

Figure 3:
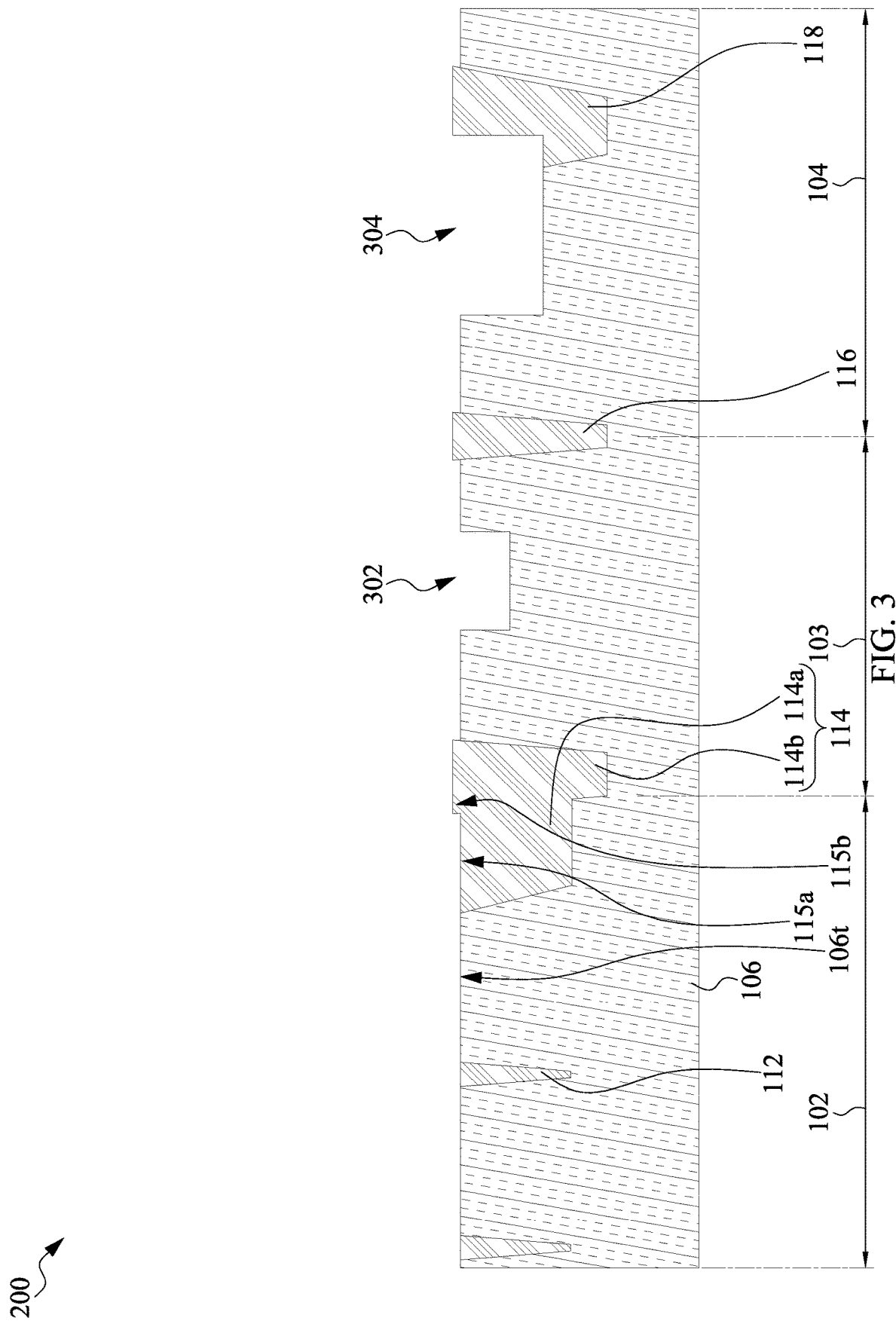

Referring to FIG. 3, in some embodiments, one or more trenches 302, 304 are formed in an upper region of the substrate 106 as gate trenches in the second region 103 and the third region 104. The trenches 302 and 304 may be formed by one or more photolithography processes followed by one or more etching processes performed on the substrate 106 between the isolation structures 114, 116 and 118. The trench 302 in the second region 103 may have a dimension less than a dimension of the trench 304 in the third region 104.

Figure 4:
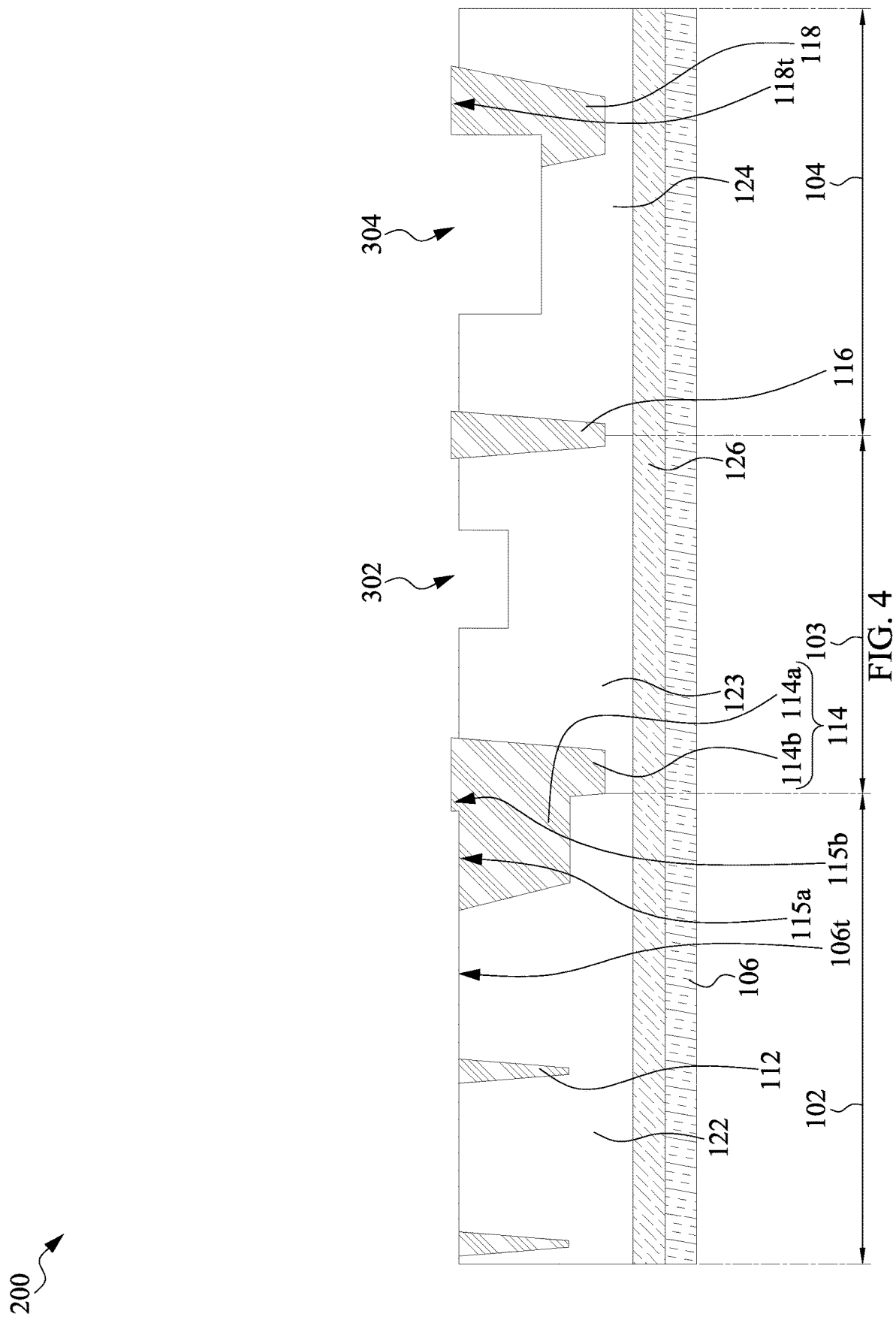

Referring to FIG. 4, in some embodiments, the substrate 106 may then undergo ion implantation to form doped regions (e.g., n-type or p-type) between the isolation structures 112, 114, 116 and 118 as device wells, and other doped structures. For example, a doped region 122 is formed between the isolation structures 112 and 114 as a low-voltage well. A doped region 123 is formed between the isolation structures 114 and 116 as a medium-voltage well. In addition, a doped region 124 is formed in the third region 104 as a high-voltage well. Alternatively or additionally, a deep well 126 (e.g., a deep n well) is formed in the substrate 106.

Figure 5:
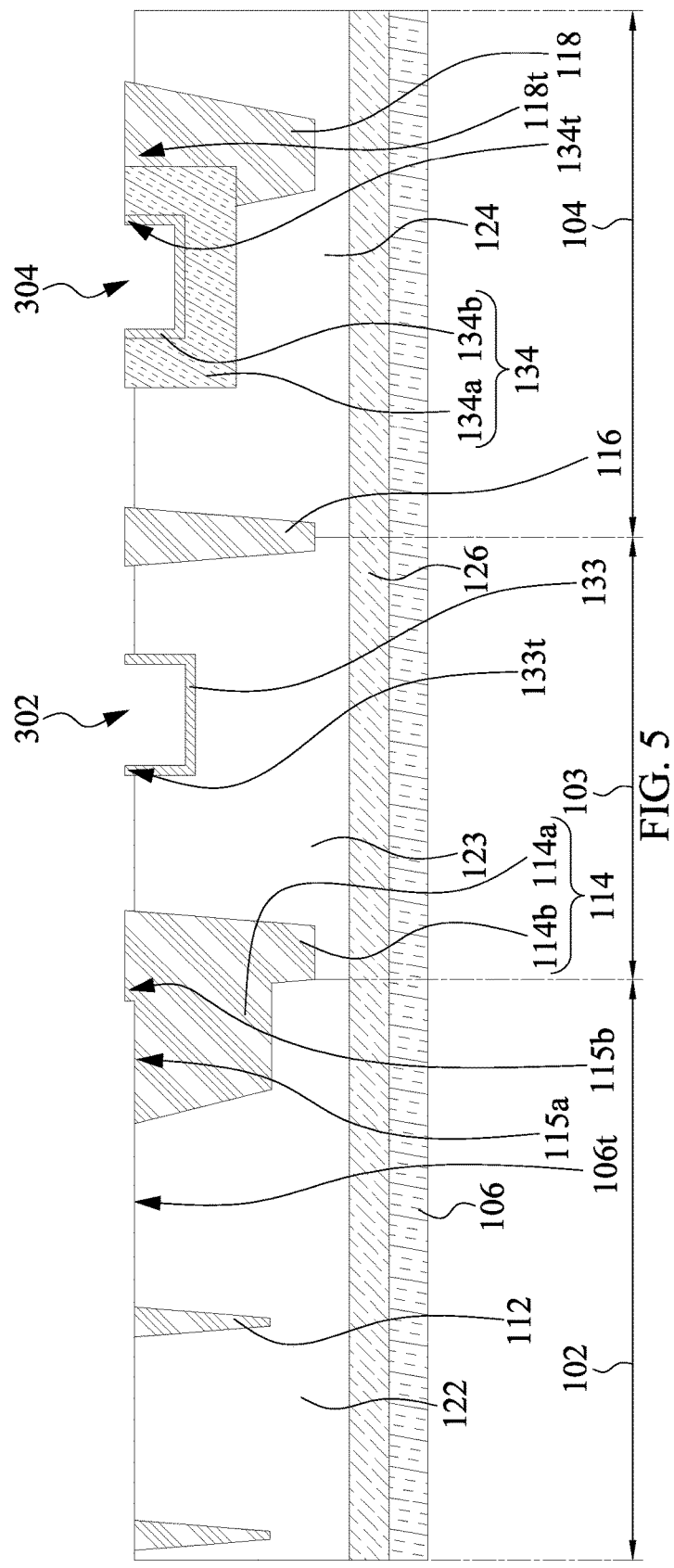

Referring to FIG. 5, in some embodiments, a gate dielectric layer 133 and a gate dielectric layer 134 are formed along the trenches 302 and 304, respectively. The gate dielectric layers 133 and 134 may be configured as a medium-voltage gate dielectric layer 133 and a high-voltage gate dielectric layer 134, respectively. The gate dielectric layer 133 and the gate dielectric layer 134 may be formed by different thermal process or deposition processes combined with patterning processes and may be formed with different thicknesses. A thickness of the gate dielectric layer 134 may be about 2 to 5 times a thickness of the gate dielectric layer 133. The gate dielectric layer 133 and the gate dielectric layer 134 may be oxide layers, such as silicon dioxide layers, but other suitable gate dielectric materials are also applicable. The thicknesses of the gate dielectric layer 133 and the gate dielectric layer 134 depend on applications, ranging from about several or tens of nanometers (nm) for current nodes to several angstroms (Å) for emerging nodes. In some embodiments, the gate dielectric layer 134 may be a multi-layered structure. For example, the gate dielectric layer 134 may include a first dielectric layer 134a and a second dielectric layer 134b. The first dielectric layer 134a and the second dielectric layer 134b may include different gate dielectric materials.

The gate dielectric layers 133 and 134 may protrude from the substrate 106 having upper surfaces 133t and 134t at positions higher than the upper surface 106t of the substrate 106. In some embodiments, the upper surface 134t of the gate dielectric layer 134 may be aligned with the upper surface 133t of the gate dielectric layer 133. Alternatively, the upper surfaces 133t and 134t of the gate dielectric layers 133 and 134 may be aligned with (or substantially coplanar with) the upper surface 106t of the substrate 106. In some alternative embodiments, the upper surface 134t of the gate dielectric layer 134 may be aligned with the upper surface 118t of the isolation structure 118.

Figure 6:
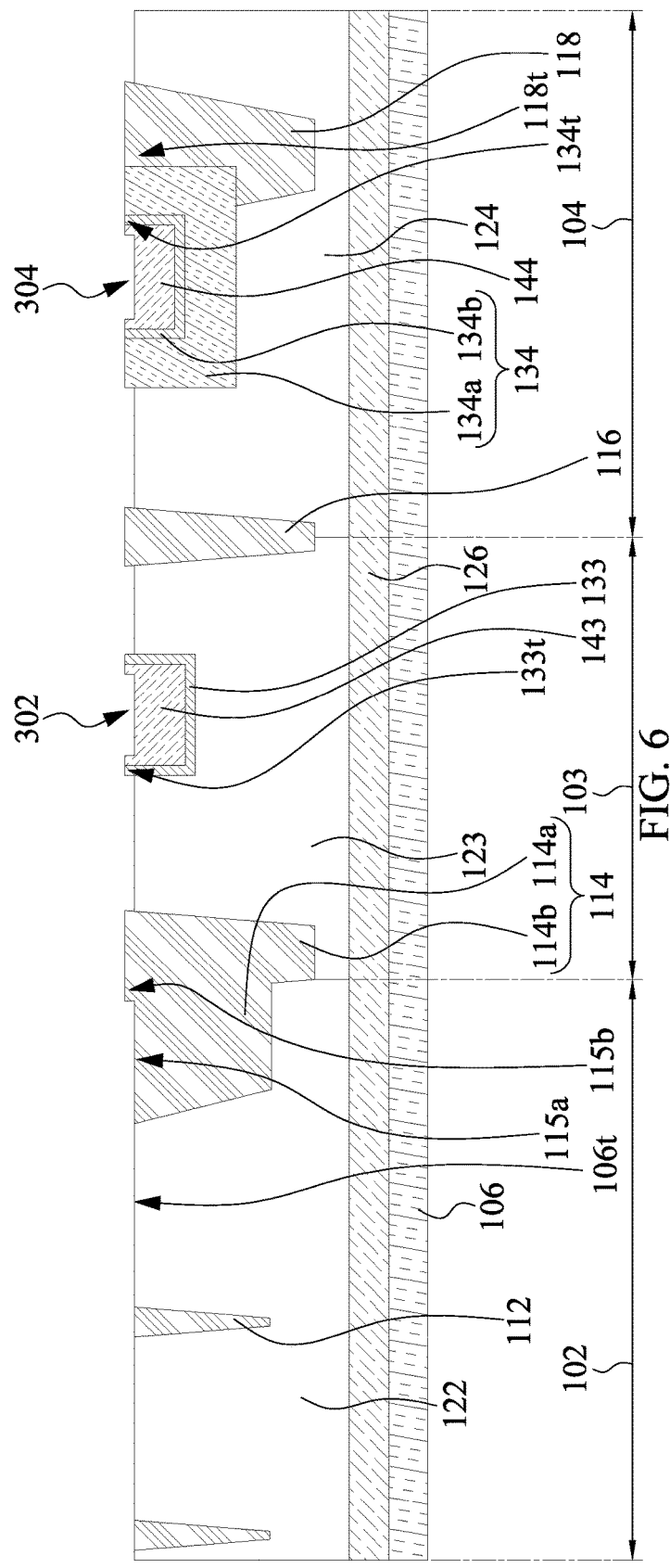

Referring to FIG. 6, in some embodiments, a gate electrode 143 and a gate electrode 144 are respectively formed on the gate dielectric layer 133 and the gate dielectric layer 134 filling spaces of the trenches 302 and 304. The gate electrode 143 and the gate electrode 144 may be configured as a medium-voltage gate electrode 143 and a high-voltage gate electrode 144, respectively. The gate electrodes 143 and 144 are formed through one or more deposition processes (e.g., chemical vapor deposition, physical vapor deposition, etc.). The gate electrodes 143 and 144 may be made of doped polysilicon. Alternatively or additionally, an upper surface of the gate electrode 143 is aligned with the upper surface 133t of the gate dielectric layer 133, and an upper surface of the gate electrode 144 is aligned with the upper surface 134t of the gate dielectric layer 134. In some embodiments, the gate electrodes 143 and 144 have recessed profiles.

Figure 7:
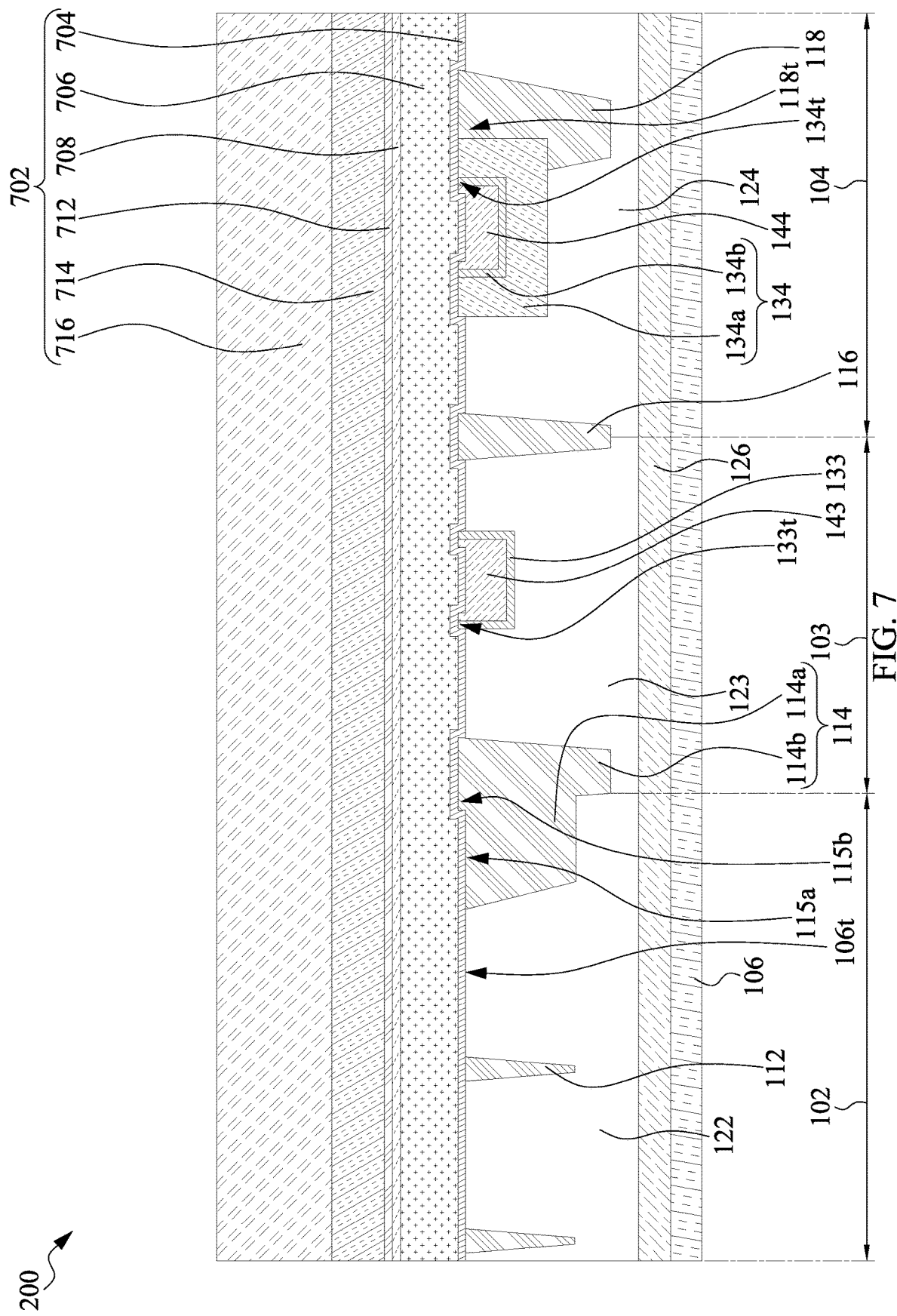

FIGS. 7 to 10 illustrate a formation of a supporting layer. The respective step is shown as operation 1200 of the method 100 in FIG. 1. Referring to FIG. 7, in some embodiments, a first supporting layer 702 is formed over the gate electrodes 143 and 144. In some embodiments, the first supporting layer 702 is formed to cover the first region 102, the second region 103 and the third region 104. The first supporting layer 702 may include a stack of different materials formed by deposition techniques. For example, the first supporting layer 702 may include a stack of CMP protection layers disposed over a sacrificial dielectric layer 704 (e.g., a sacrificial silicon dioxide layer). An example of such stack of CMP protection layers may include a masking layer 706 (e.g., a silicon nitride layer) and a polysilicon liner 708. A stack of hard mask layers may be deposited over the stack of CMP protection layers. An example of such stack of hard mask layers may include hard mask layers 712 and 714 (e.g., a dielectric liner 712 and a dielectric layer 714 disposed over the dielectric liner 712). The hard mask layer 712 may be a silicon nitride liner and the hard mask layer 714 may be a silicon dioxide layer. The first supporting layer 702 may further include a polysilicon layer 716 disposed over the stack of hard mask layers and may be configured to define a desired height of the first supporting layer 702.

Figure 8:
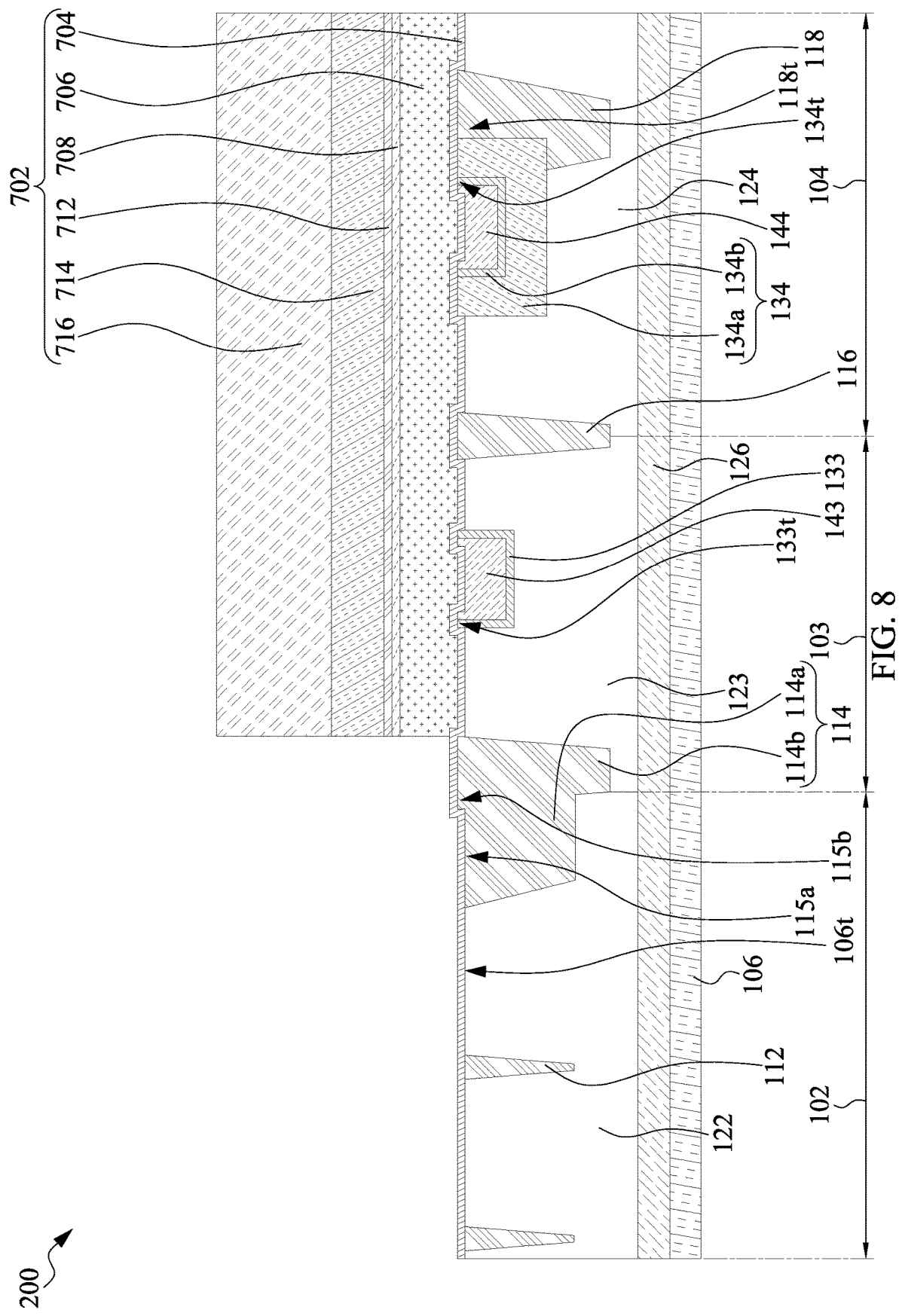

Referring to FIG. 8, in some embodiments, the first supporting layer 702 is patterned so as to be removed from the first region 102 by a series of dry etching processes. In some embodiments, the sacrificial dielectric layer 704 may be left in the first region 102.

Figure 9:
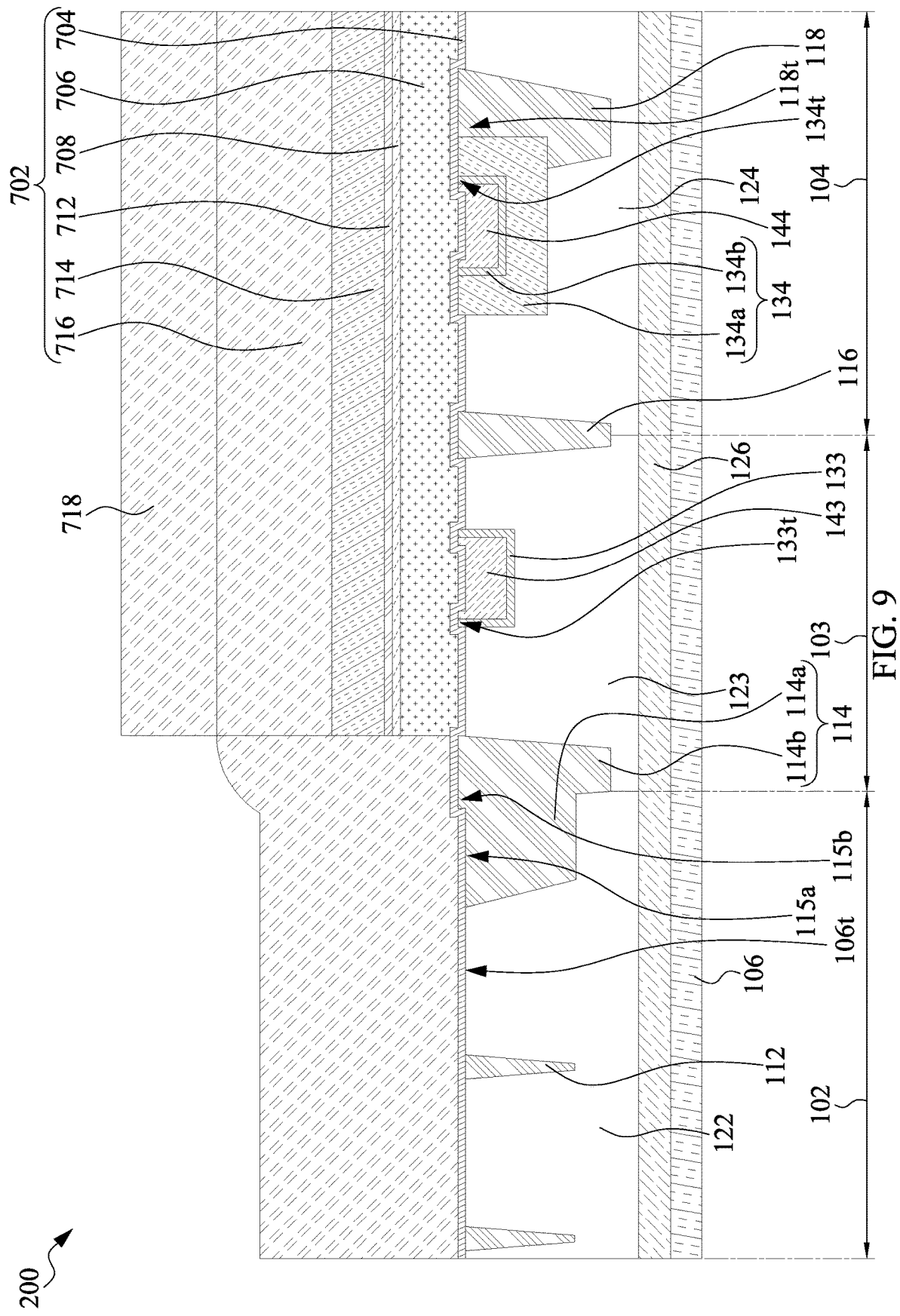

Referring to FIG. 9, in some embodiments, a second supporting layer 718 is formed over the substrate 106 in the first region 102 and over the first supporting layer 702 in the second region 103 and the third region 104. In some embodiments, the second supporting layer 718 may include a polysilicon layer and is deposited to a designed thickness to define a tilt angle of a slanted sidewall after an etch-back process discussed below.

Figure 10:
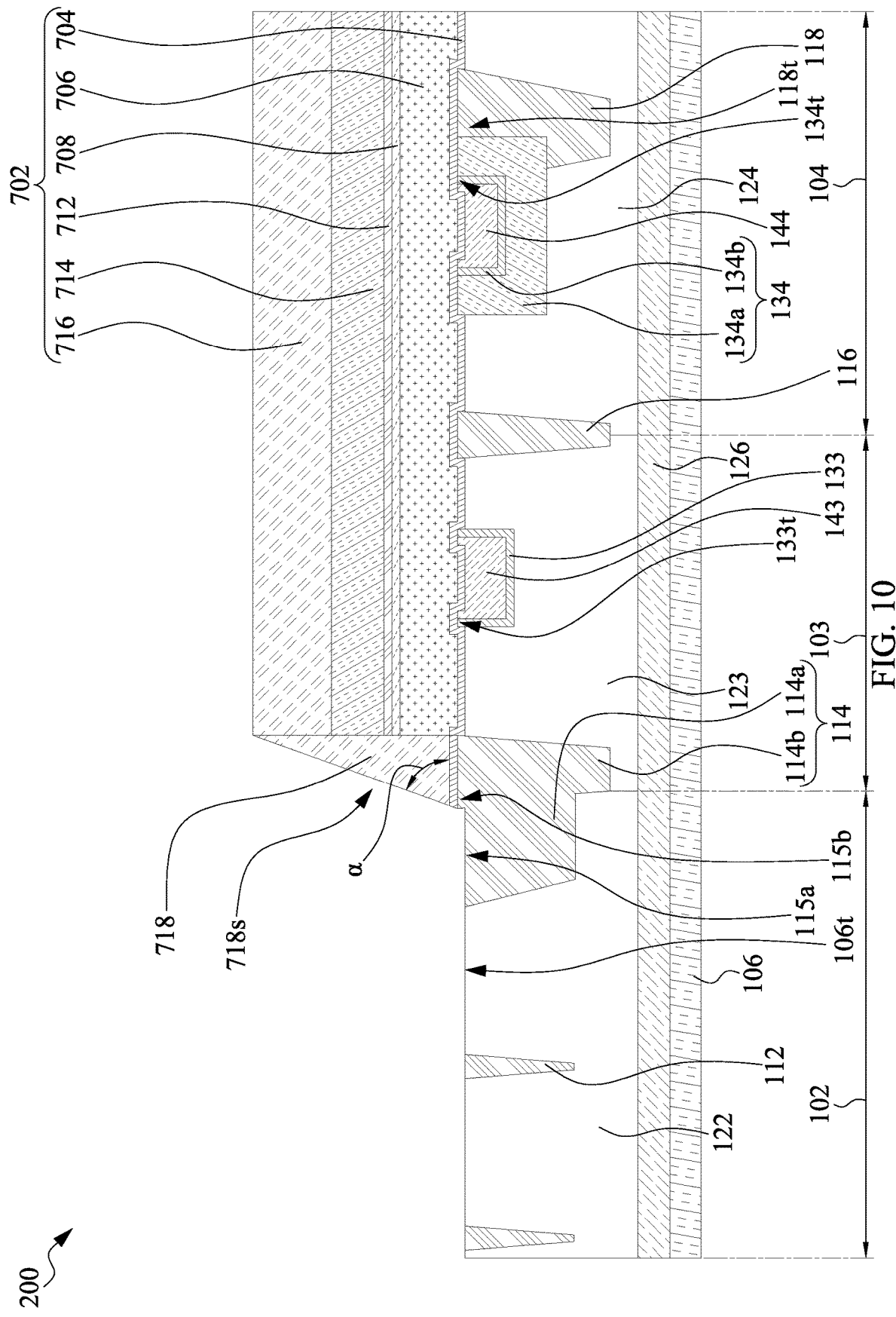

Referring to FIG. 10, in some embodiments, the second supporting layer 718 is etched back so as to be removed from the first region 102. In some embodiments, a portion of the second supporting layer 718 over the first supporting layer 702 is completely removed. In some embodiments, a series of blanket etching processes is performed on the first supporting layer 702 and the second supporting layer 718. The etching processes may include a dry etch (e.g., a plasma etch with tetrafluoromethane ($CF_4$), sulfur hexafluoride ($SF_6$), nitrogen trifluoride ($NF_3$), etc.).

In some embodiments, the second supporting layer 718 defines a slanted sidewall 718s. In alternative embodiments, the first supporting layer 702 and the second supporting layer 718 collectively define a continuous and slanted sidewall 718s. The slanted sidewall 718s is tilted from bottom to top toward the third region 104 and may have a tilt angle α substantially equal to 45 degrees or in a range of about 30 degrees to about 60 degrees. In some embodiments, the slanted sidewall 718s ends at the upper surface 115b of the second portion 114b of the isolation structure 114. In other words, the second supporting layer 718 only covers the upper surface 115b of the second portion 114b, while the upper surface 115a of the first portion 114a is substantially free of the second supporting layer 718.

Figure 11:
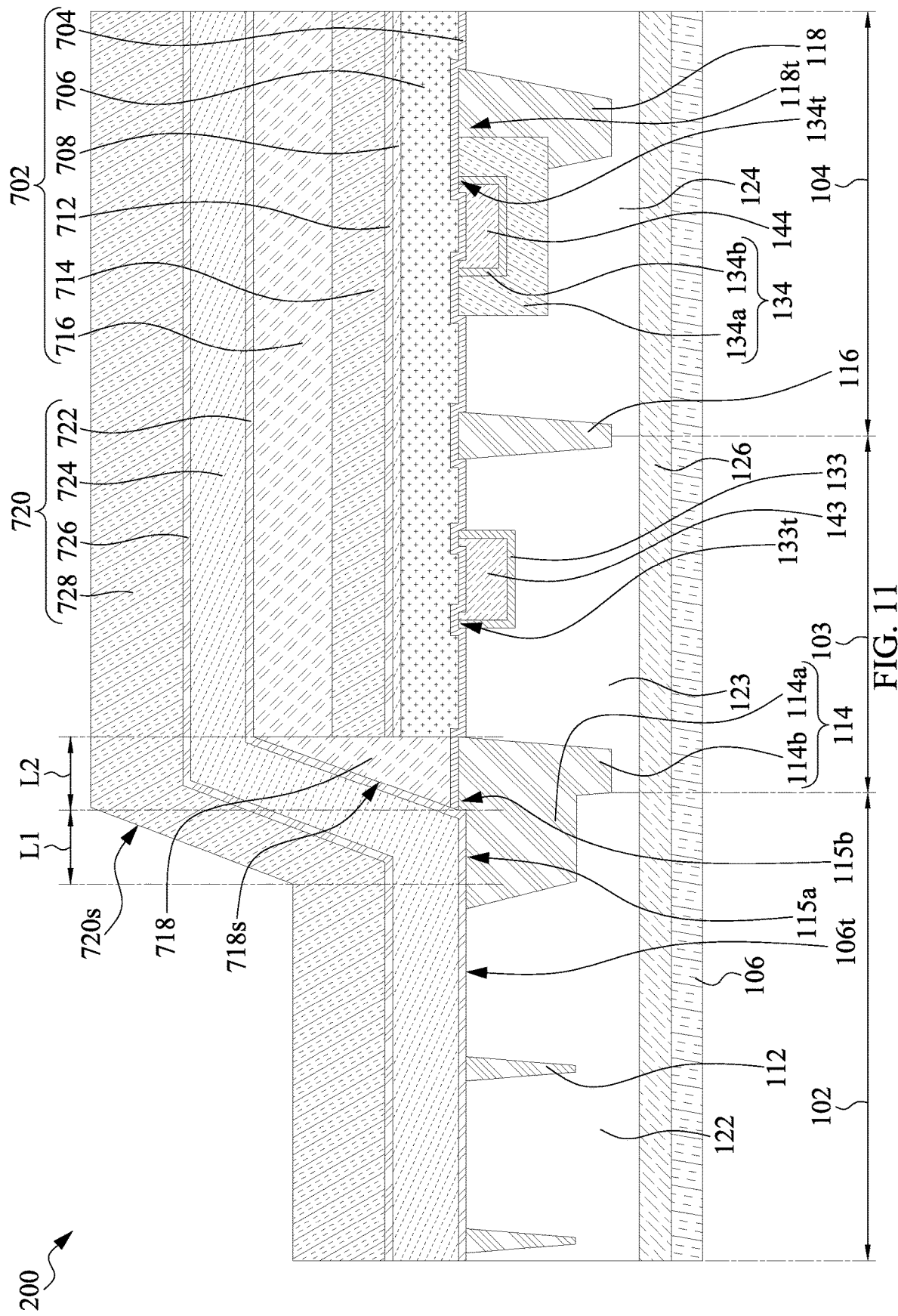

Referring to FIG. 11, in some embodiments, a precursor layer 720 is formed over the substrate 106 in the first region 102, over the second supporting layer 718 in the second region 103, and over the first supporting layer 702 in the third region 104. The precursor layer 720 may be configured as a low-voltage gate precursor layer or a sacrificial gate precursor layer. In some embodiments, the precursor layer 720 may include a gate dielectric layer 722 (e.g., an interfacial layer (IL), a high-k dielectric layer, and a barrier layer (e.g., titanium nitride) stacked in that order), a gate electrode layer 724, and hard mask layers 726 and 728 (e.g., a silicon dioxide layer 728 stacked on a silicon nitride liner 726, or one or more stacked silicon nitride and silicon dioxide layers). The gate dielectric layer 722 and the gate electrode layer 724 may respectively be configured as a low-voltage gate dielectric layer (or a sacrificial gate dielectric layer) 722 and a low-voltage gate electrode layer (or a sacrificial gate electrode layer) 724.

In some embodiments, the precursor layer 720 is substantially conformal with respect to a profile of the first supporting layer 702 and the second supporting layer 718. In some embodiments, the precursor layer 720 defines a slanted sidewall 720s. In some embodiments, a length L1 of protection by the slanted sidewall 720s of the upper surface 115a is substantially equal to a length L2 of protection by the slanted sidewall 718s of the upper surface 115b. In some embodiments, the length L1 is substantially equal to 0.25 micrometers (μm) or in a range of about 0.1 μm to about 0.5 μm.

Figure 12:
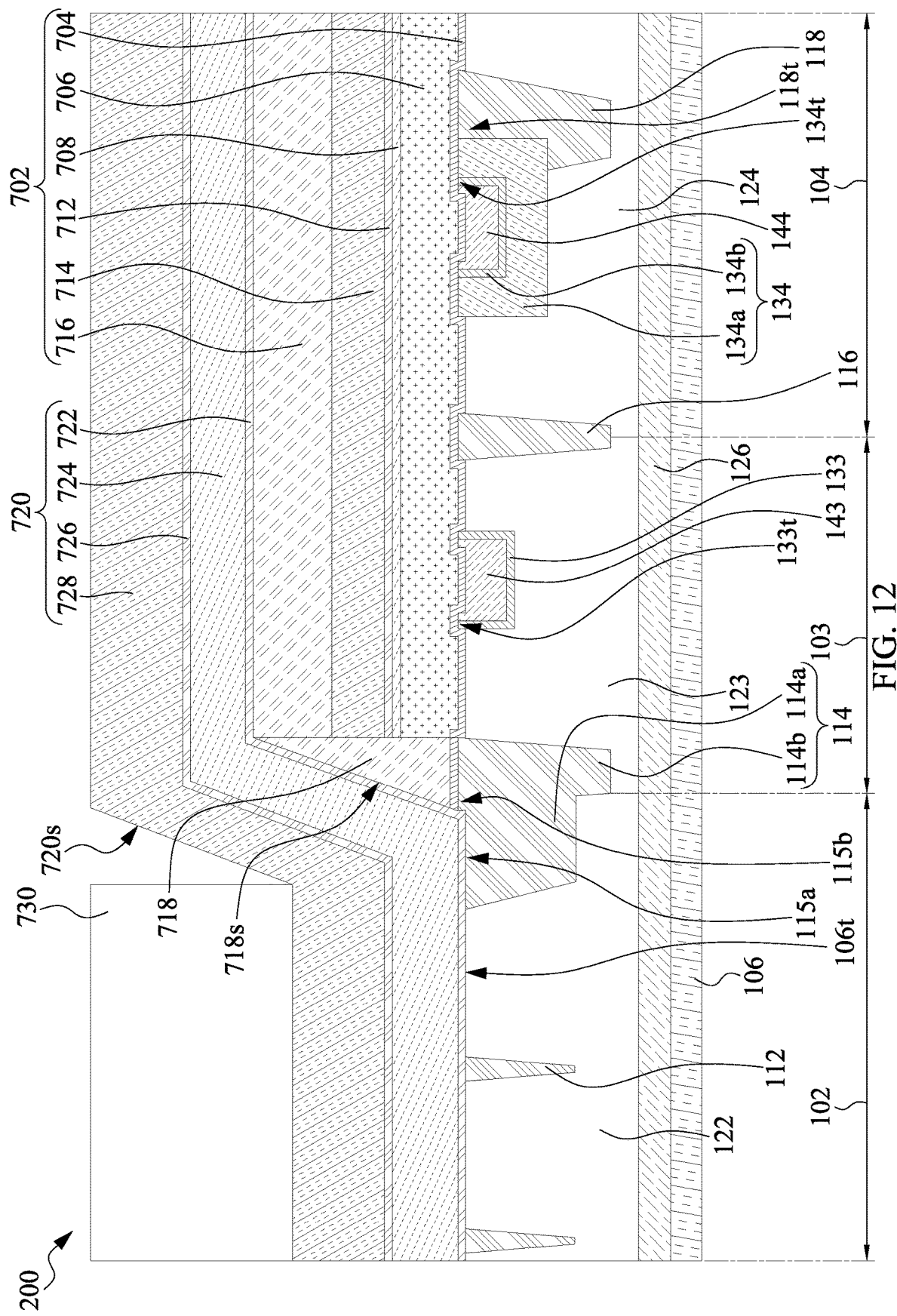

FIGS. 12 to 15 illustrate a removal of the supporting layer (e.g., the first and second supporting layers 702 and 718) and a portion of the isolation structure 114. The respective step is shown as operation 1300 of the method 100 in FIG. 1. Referring to FIG. 12, in some embodiments, a patterned layer 730 is formed over the precursor layer 720 in the first region 102. In some embodiments, the patterned layer 730 may be a patterned photoresist layer. In some embodiments, a photoresist layer is formed over the precursor layer 720, and the photoresist layer is then patterned to form openings exposing portions of the precursor layer 720 in the second region 103 and the third region 104.

Figure 13:
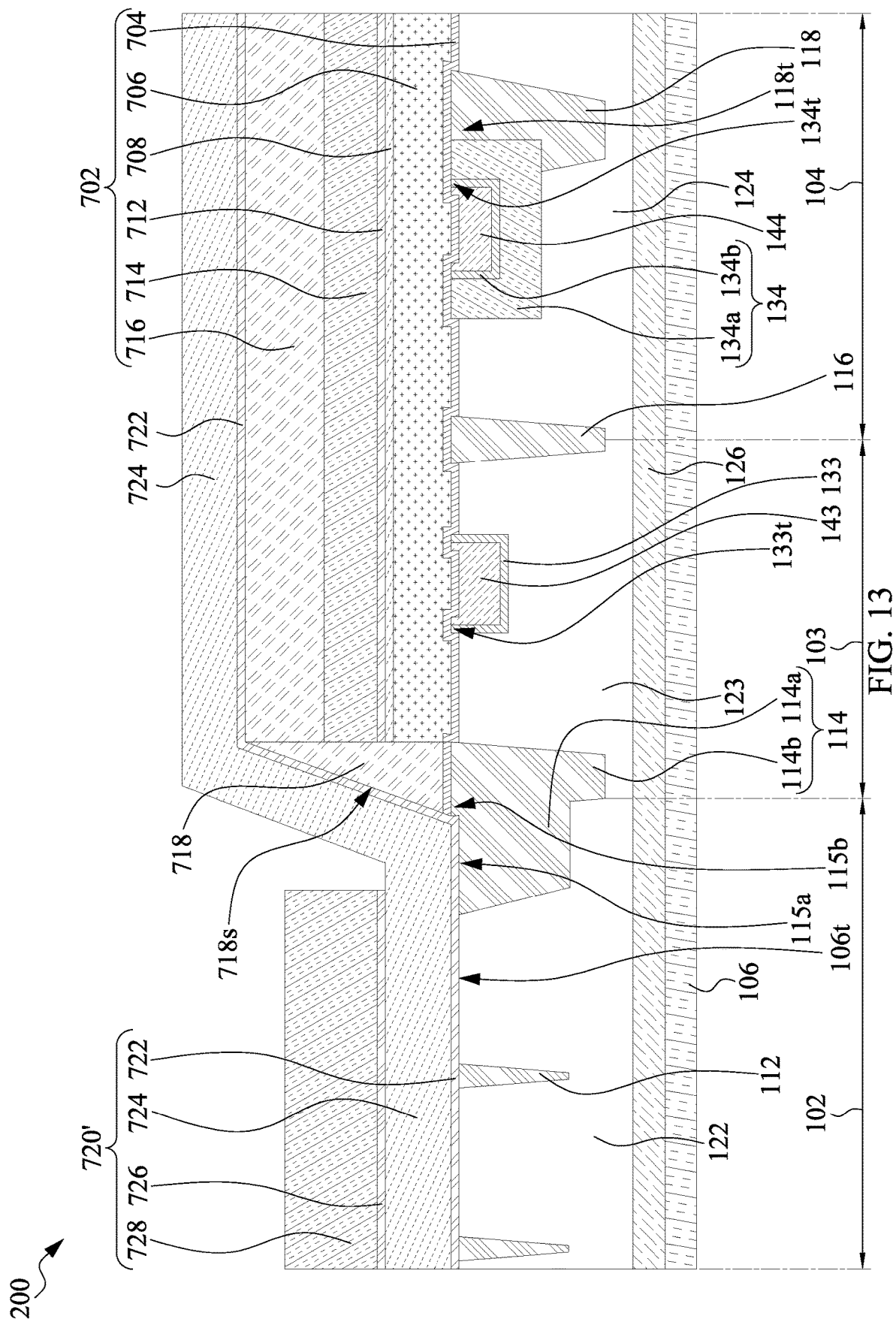

Referring to FIG. 13, in some embodiments, the precursor layer 720 is removed from the second region 103 and the third region 104, thereby forming an altered precursor layer 720' in the first region 102. In some embodiments, portions of the hard mask layers 726 and 728 are removed from the second region 103 and the third region 104. In some embodiments, as shown in FIG. 13, the hard mask layers 726 and 728 are completely removed from the second region 103 and the third region 104.

Figure 14:
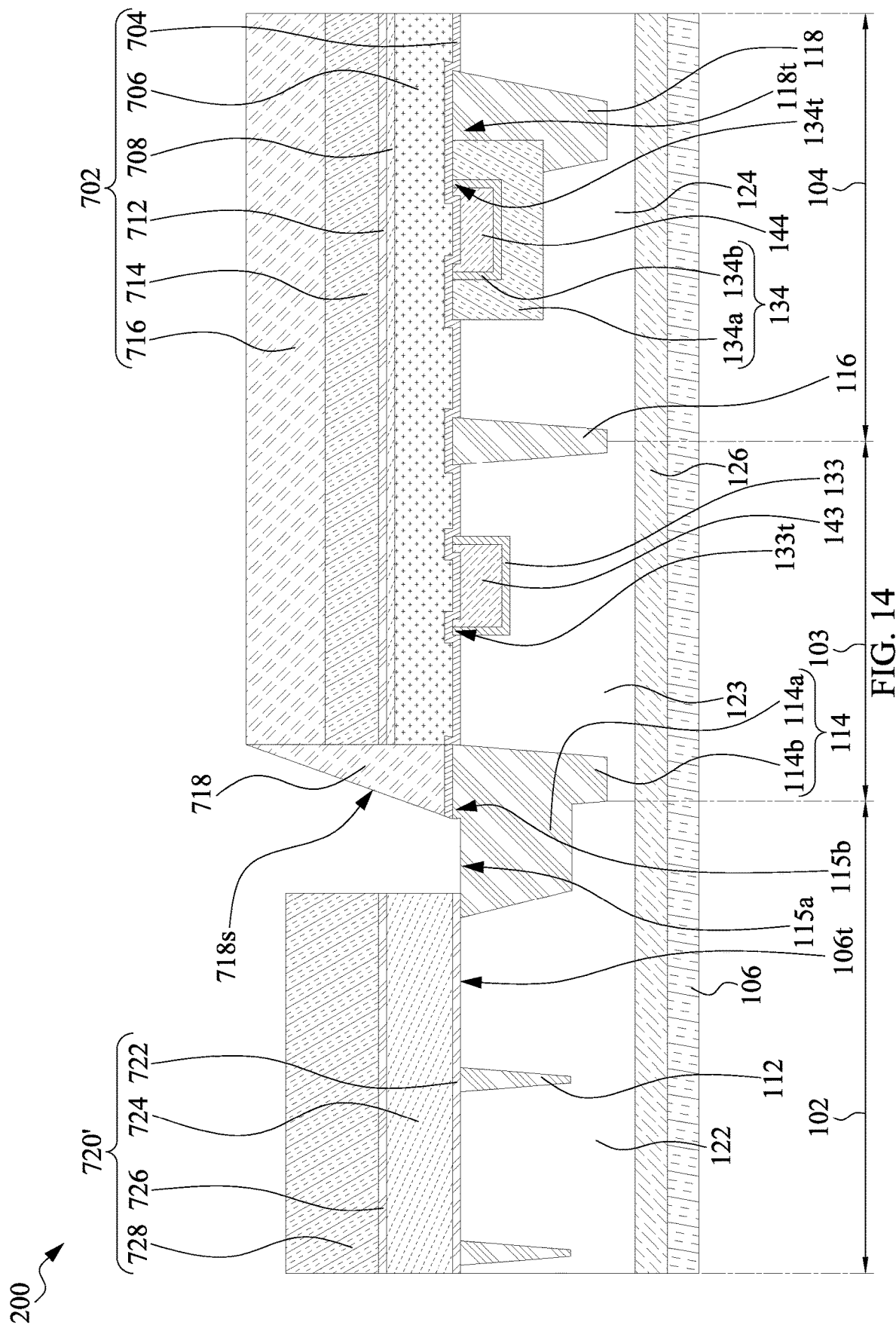

Referring to FIG. 14, in some embodiments, the gate dielectric layer 722 and the gate electrode layer 724 are removed from the second region 103 and the third region 104. The precursor layer 720 may be removed from the boundary region completely due to the continuous and slanted sidewall 718s. The removal of the precursor layer 720 from the boundary region minimizes contamination by residues from the precursor layer 720.

Figure 15:
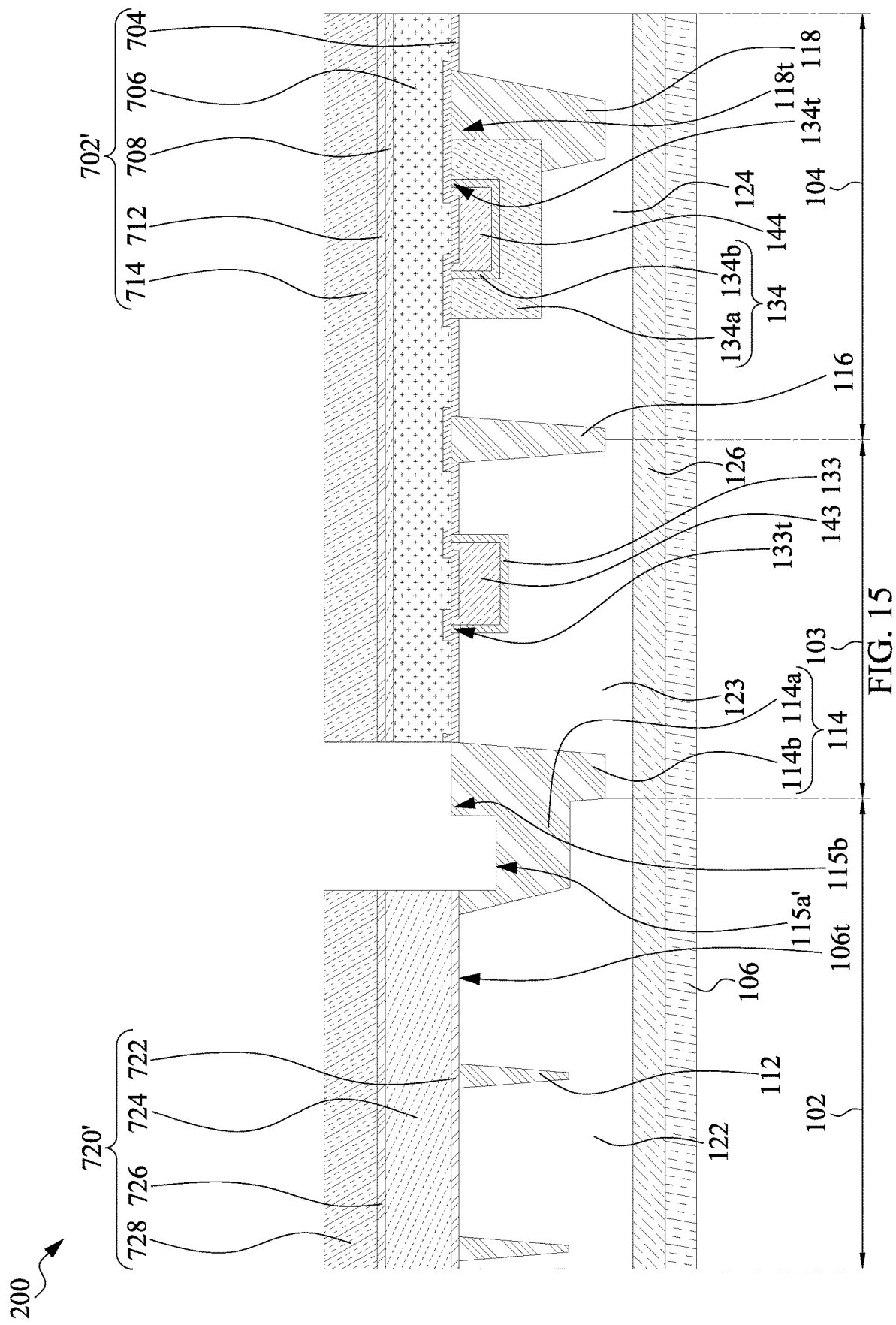

Referring to FIG. 15, in some embodiments, the second supporting layer 718 and the polysilicon layer 716 of the first supporting layer 702 are removed from the second region 103 and the third region 104, thereby forming an altered supporting layer 702' in the second region 103 and the third region 104. In some embodiments, the removal of the second supporting layer 718 and the polysilicon layer 716 further removes a portion of the hard mask layer 728. Hence, the altered precursor layer 720' has a reduced height.

In some embodiments, the removal of the second supporting layer 718 and the polysilicon layer 716 further results in removal of a portion of the isolation structure 114. For example, the upper surface 115a (FIG. 14) of the first portion 114a which is not covered by the second supporting layer 718 is removed and forms a new upper surface 115a'. The upper surface 115b of the second portion 114b which is covered by the second supporting layer 718 remains intact after the removal of the second supporting layer 718 and the polysilicon layer 716. The upper surface 115a' and the upper surface 115b may be planar surfaces. The upper surface 115a' may be located at a position lower than the upper surface 106t of the substrate 106. Accordingly, the upper surface of the isolation structure 114 has a stepped profile after the removal of the second supporting layer 718 and the polysilicon layer 716.

In alternative embodiments where the upper surface 115a of the first portion 114a is initially aligned with (or substantially coplanar with) the upper surface 115b of the second portion 114b (i.e., prior to the removal of the second supporting layer 718 and the polysilicon layer 716), the upper surface 115a of the first portion 114a which is not covered by the second supporting layer 718 may still be removed and forms a new upper surface 115a'. Additionally, the upper surface 115b of the second portion 114b which is covered by the second supporting layer 718 remains intact after the removal of the second supporting layer 718 and the polysilicon layer 716. Accordingly, the upper surface of the isolation structure 114 in alternative embodiments may also have a stepped profile after the removal of the second supporting layer 718 and the polysilicon layer 716.

Figure 16:
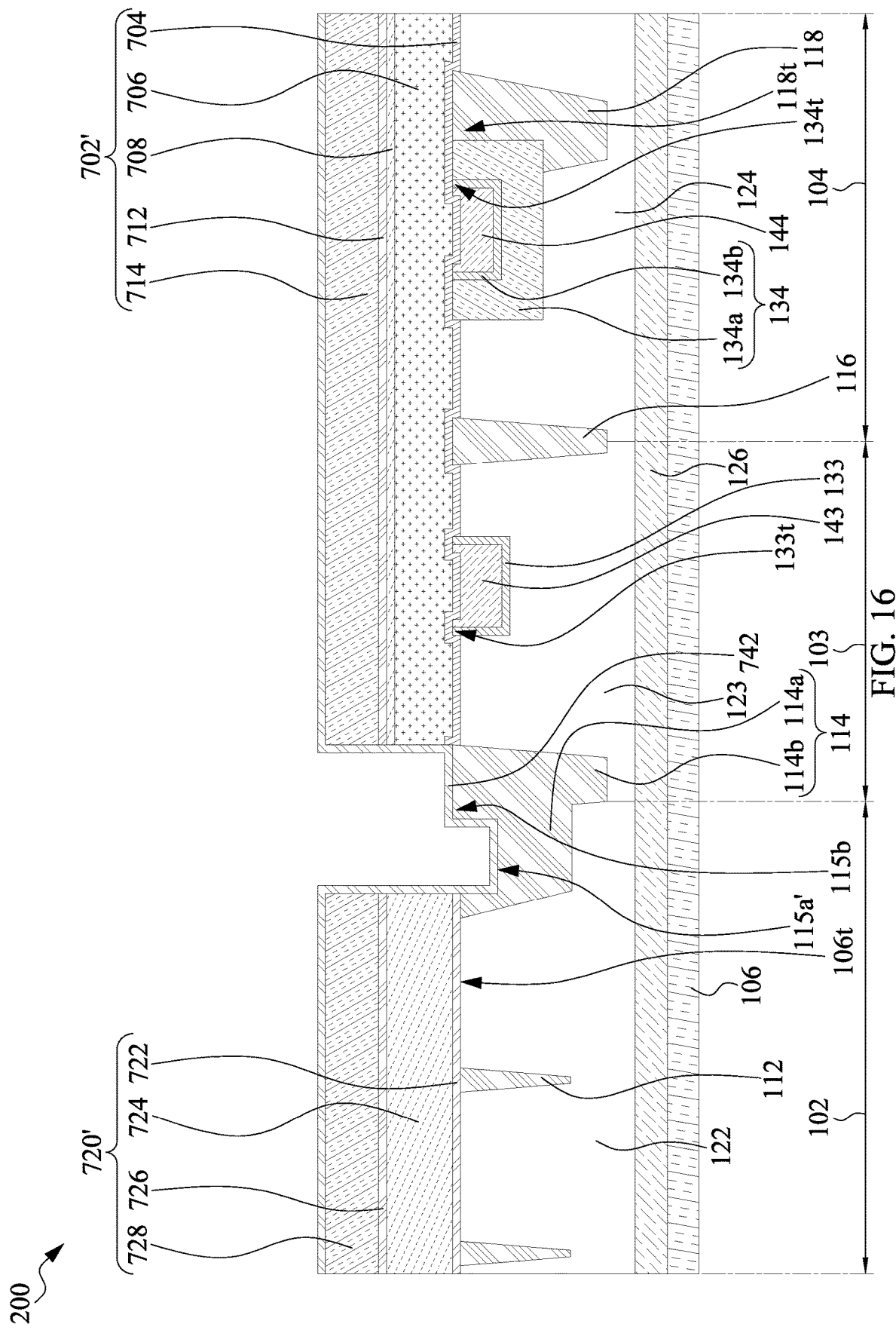

FIGS. 16 to 29 illustrate a formation of a boundary structure. The respective step is shown as operation 1400 of the method 100 in FIG. 1. Referring to FIG. 16, in some embodiments, a boundary filling process is performed to fill a slit between the first region 102 and the second region 103. The boundary filling process may include a sealing process which is performed to form a sealing layer 742 over the altered precursor layer 720' and the altered supporting layer 702'. The sealing layer 742 may be configured to protect sidewalls of the altered precursor layer 720' in the first region 102. Additionally, the sealing layer 742 may further protect sidewalls of the altered supporting layer 702'. The sealing layer 742 may include dielectric materials, such as silicon nitride. The sealing layer 742 may be deposited by a conformal deposition technique (e.g., CVD). In some embodiments, the sealing layer 742 is substantially conformal with respect to the stepped profile of the isolation structure 114. In some embodiments, a thickness of the sealing layer 742 may be in a range of about 40 Å to about 60 Å.

Figure 17:
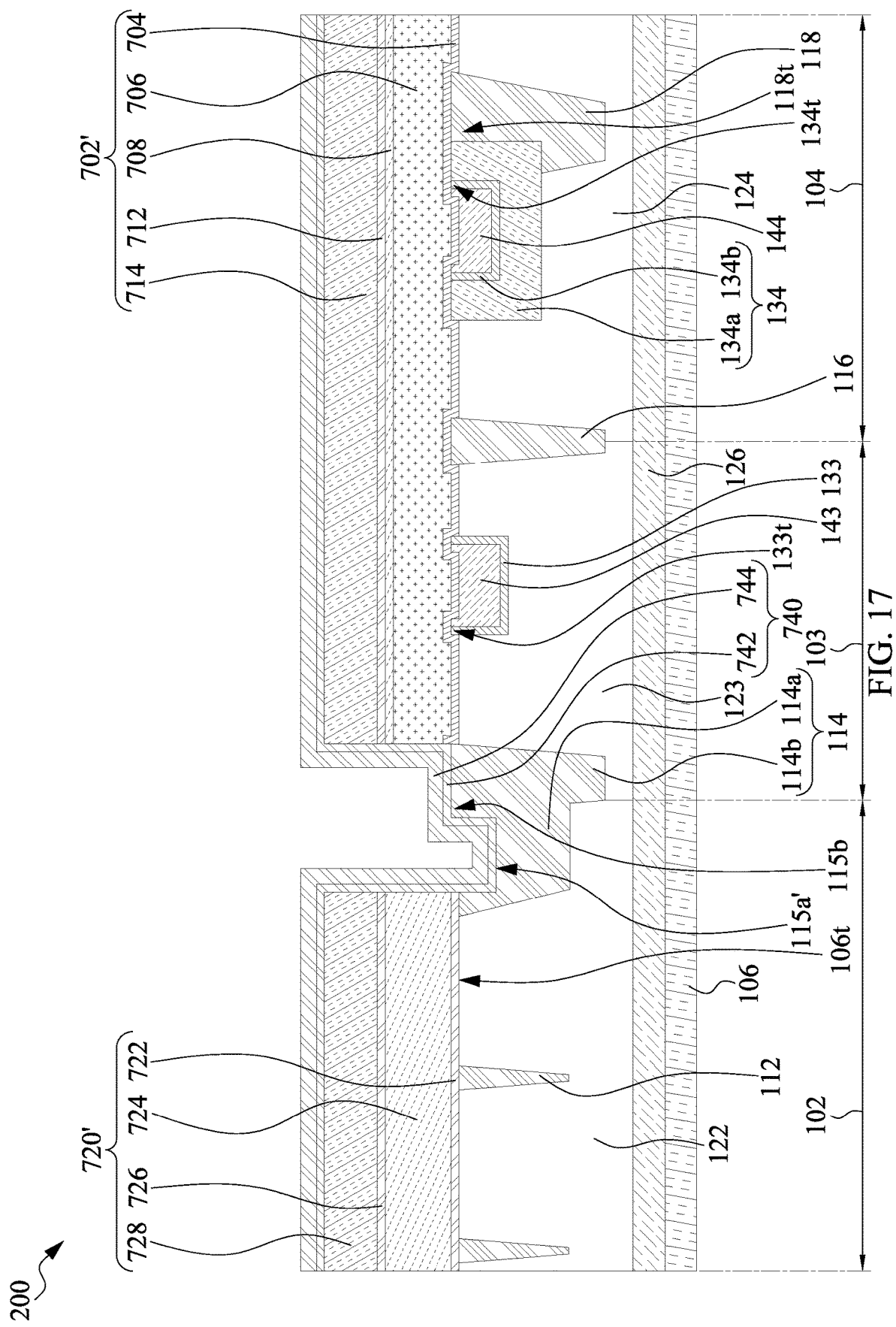

Referring to FIG. 17, in some embodiments, the boundary filling process further includes forming another sealing layer 744 over the altered precursor layer 720' and the altered supporting layer 702'. The sealing layer 744 may be configured to enhance a sealing performance of the sealing layer 742. The material of the sealing layer 744 may be selected from the same candidate materials as the sealing layer 742. In some embodiments, a thickness of the sealing layer 744 may be in a range of about 100 Å to about 300 Å. The sealing layers 742 and 744 may collectively be hereinafter referred to as a sealing layer 740. In alternative embodiments, the sealing process is performed to form a single sealing layer 740 over the altered precursor layer 720' and the altered supporting layer 702', instead of forming a stack of sealing layers 742 and 744.

Figure 18:
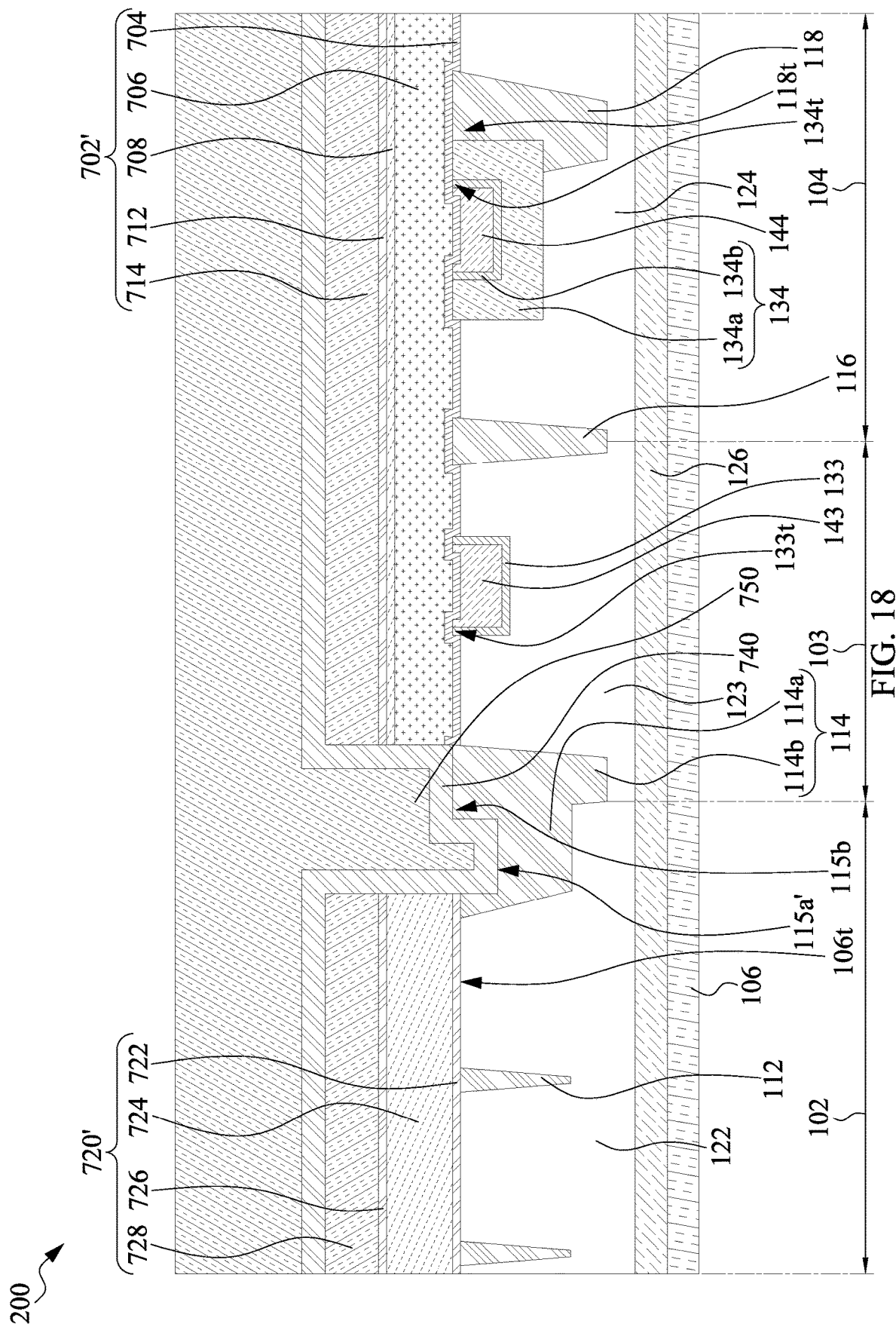

Referring to FIG. 18, in some embodiments, the boundary filling process further includes forming a filling layer 750 over the altered precursor layer 720' and the altered supporting layer 702'. The filling layer 750 may be deposited on the sealing layer 740. The filling layer 750 may be formed conformally and may be formed by a chemical vapor deposition (CVD) process. The filling layer 750 may include dielectric materials different from those of the sealing layer 740. In some embodiments, the filling layer 750 includes oxide material, such as silicon dioxide. A thickness of the filling layer 750 is selected such that the slit between the first region 102 and the second region 103 may be well filled. In some embodiments, the deposited thickness of the filling layer 750 may be in a range of hundreds of nanometers (nm). In some embodiments, the thickness of the filling layer 750 may be between about 400 nm and about 600 nm.

Figure 19:
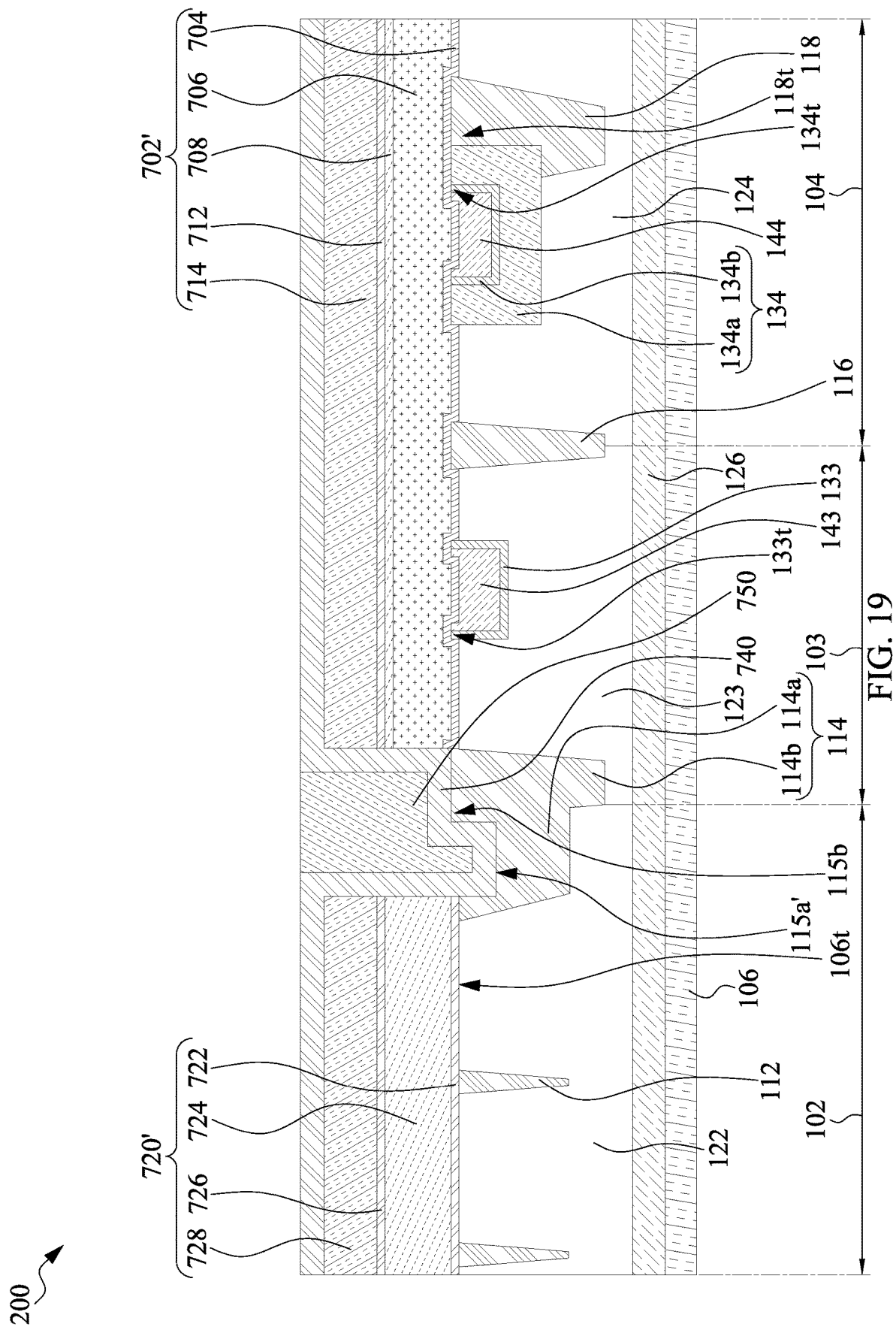

Referring to FIG. 19, in some embodiments, a portion of the filling layer 750 over the sealing layer 740 is removed. In some embodiments, the portion of the filling layer 750 is removed by a planarization process, such as a chemical mechanical polish (CMP) operation. The planarization process is performed to remove excess portions of the filling layer 750 over an upper surface of the sealing layer 740, resulting in the structure shown in FIG. 19. In some embodiments, an upper surface of the filling layer 750 is substantially coplanar with the upper surface of the sealing layer 740 after the removal of the portion of the filling layer 750.

Figure 20:
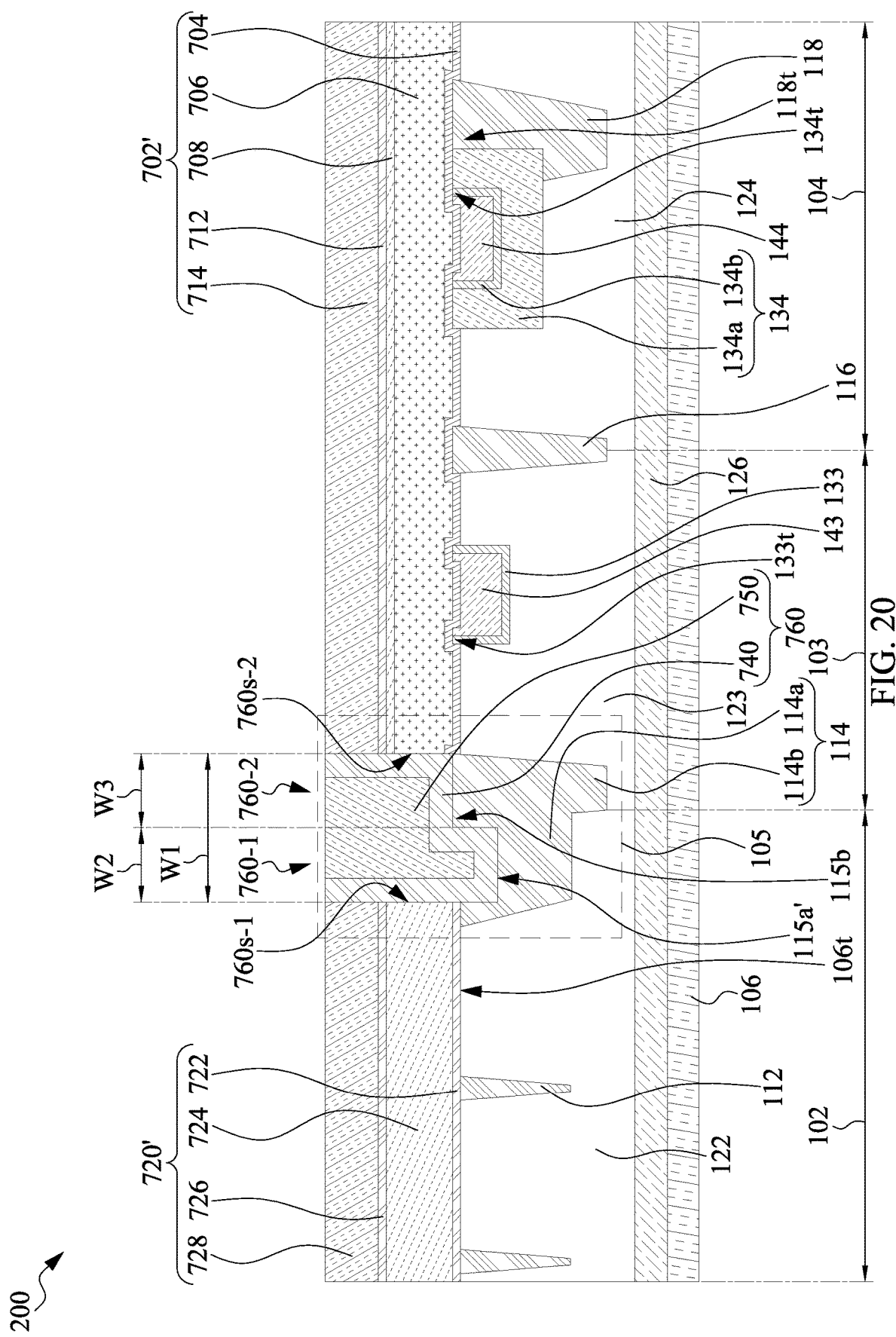

Referring to FIG. 20, in some embodiments, a portion of the sealing layer 740 over the altered precursor layer 720' and the altered supporting layer 702' is removed, thereby forming a boundary precursor 760 between the first region 102 and the second region 103. In some embodiments, an etch-back process is performed to remove the portion of the sealing layer 740 over the altered precursor layer 720' and the altered supporting layer 702'. In some embodiments, a portion of the filling layer 750 is concurrently etched back to a position laterally aligned with a remaining portion of the sealing layer 740. In other words, the upper surface of the filling layer 750 is substantially coplanar with the upper surface of the sealing layer 740.

The boundary precursor 760 may be disposed in a boundary region 105 between the first region 102 and the second region 103 (or between the first region 102 and the third region 104). The boundary precursor 760 may include a first sidewall 760s-1 close to the first region 102 and a second sidewall 760s-2 close to the second region 103 (or the third region 104). In some embodiments, the second sidewall 760s-2 is aligned with an edge of the isolation structure 114 (e.g., an edge of the second portion 114b). In some embodiments, the first sidewall 760s-1 is distal to an edge of the isolation structure 114 (e.g., an edge of the first portion 114a). In alternative embodiments, both the first sidewall 760s-1 and the second sidewall 760s-2 are distal to the edges of the isolation structure 114.

A width W1 of the boundary precursor 760 is selected such that the boundary precursor 760 provides structural support during subsequent fabrication. The width W1 of the boundary precursor 760 may be less than a width of the isolation structure 114. In some embodiments, the width W1 is in a range of about 0.25 μm to about 0.75 μm. The boundary precursor 760 may include a first portion 760-1 over the upper surface 115a' and a second portion 760-2 over the upper surface 115b. In some embodiments, a dimension of the first portion 760-1 is different from a dimension of the second portion 760-2. For example, the dimension of the first portion 760-1 is greater than the dimension of the second portion 760-2. In some embodiments, a height of the first portion 760-1 is greater than a height of the second portion 760-2. In some embodiments, a width W2 of the first portion 760-1 is substantially equal to a width W3 of the second portion 760-2. In some embodiments, the width W2 is substantially equal to 0.25 μm or in a range of about 0.1 μm to about 0.3 μm.

Figure 21:
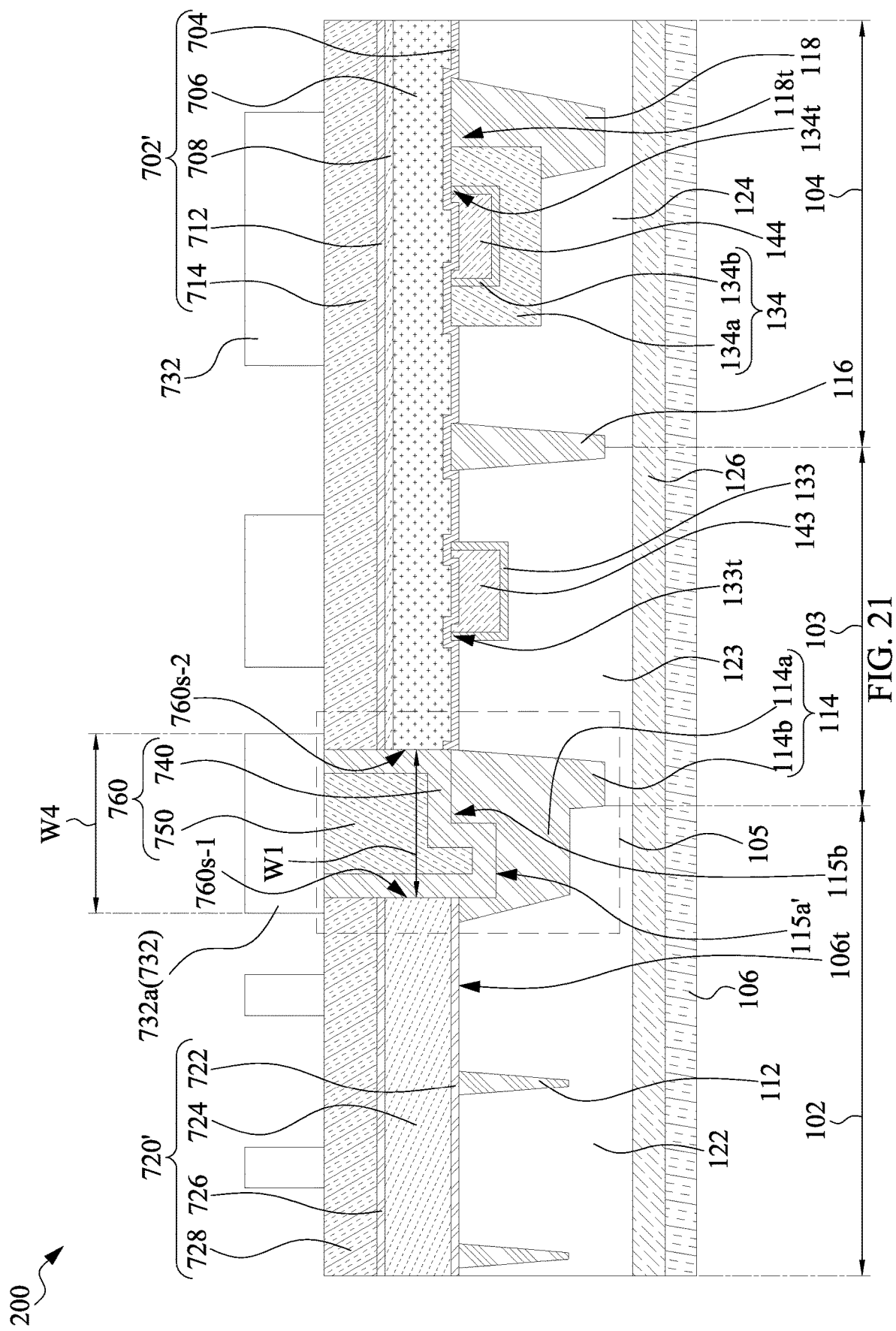

Referring to FIG. 21, in some embodiments, a patterned layer 732 is formed over the altered precursor layer 720' in the first region 102, the boundary precursor 760 in the boundary region 105, and the altered supporting layer 702' in the second region 103 and the third region 104. The patterned layer 732 may be a patterned photoresist layer. In some embodiments, a photoresist layer is formed, and the photoresist layer is then patterned to form openings exposing portions of the altered precursor layer 720' in the first region 102, and portions of the altered supporting layer 702' in the second region 103 and the third region 104. The patterned layer 732 may cover a portion of the altered supporting layer 702' over the gate electrodes 143 and 144.

The patterned layer 732 includes a portion 732a covering the boundary precursor 760 in the boundary region 105. A width W4 of the portion 732a is selected such that an upper surface of the boundary precursor 760 is completely covered by the patterned layer 732. The width W4 of the portion 732a may be greater than or equal to the width W1 of the boundary precursor 760. In some embodiments, both sidewalls 760s-1 and 760s-2 are distal to edges of the portion 732a. In alternative embodiments, the sidewall 760s-1 is aligned with an edge of the portion 732a close to the first region 102, while the sidewall 760s-2 is distal to an edge of the portion 732a close to the second region 103 (or the third region 104).

Figure 22:
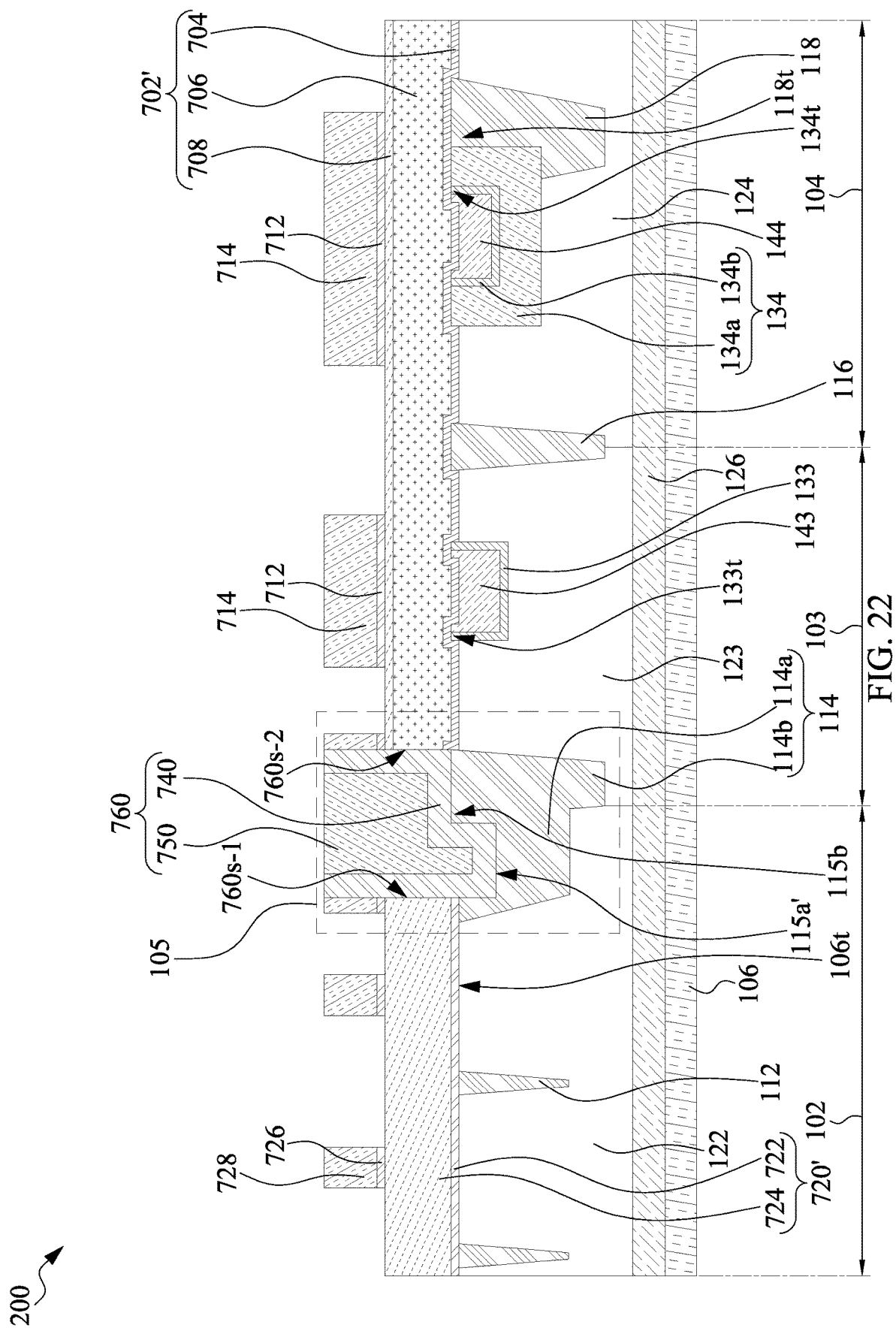

Referring to FIG. 22, in some embodiments, the hard mask layers 726 and 728 of the altered precursor layer 720' are patterned. The hard mask layers 712 and 714 of the altered supporting layer 702' are concurrently patterned. After the patterning of the hard mask layers 712, 714, 726 and 728, the patterned layer 732 is then removed.

Figure 23:
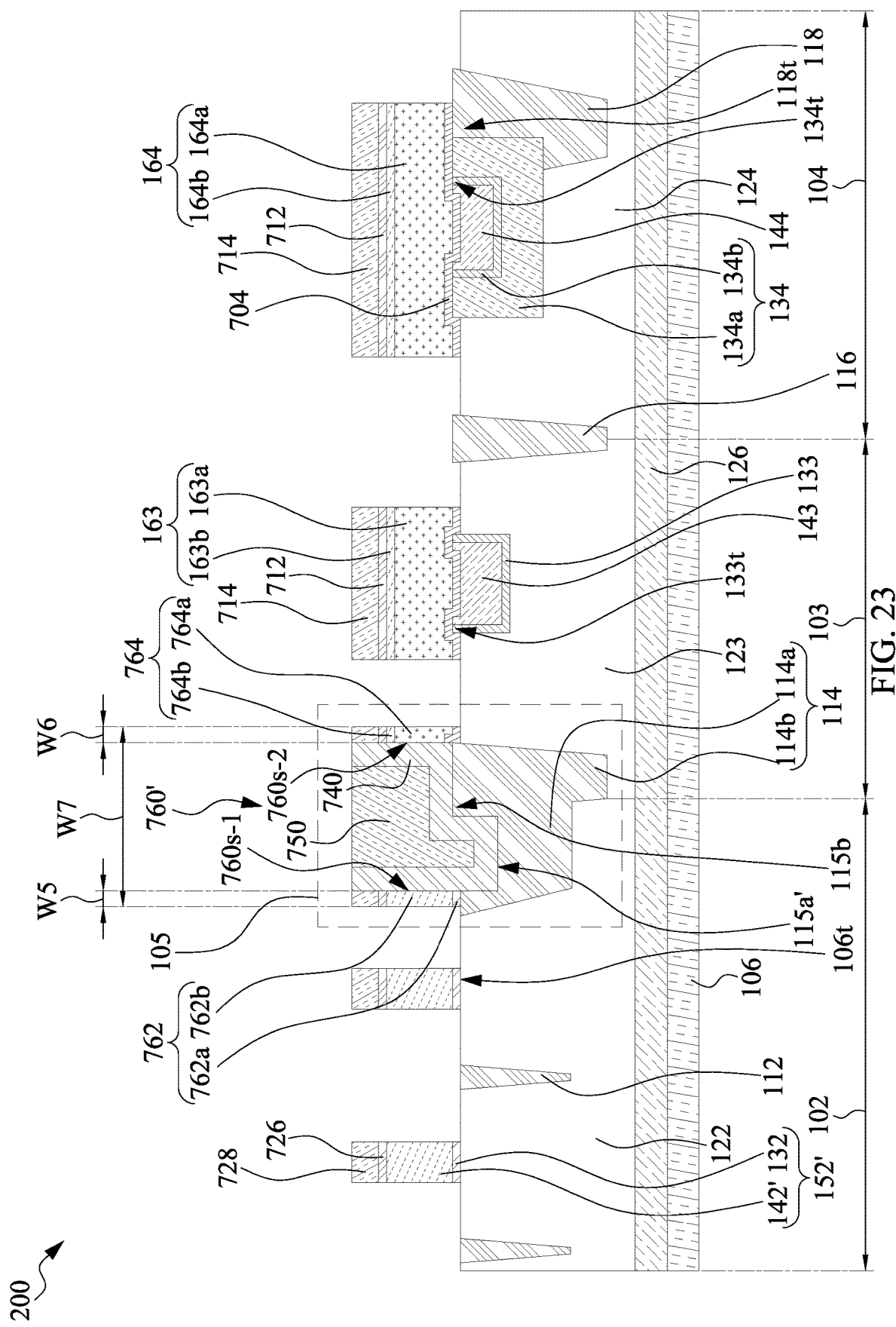

Referring to FIG. 23, in some embodiments, the gate dielectric layer 722 and the gate electrode layer 724 of the altered precursor layer 720' are patterned to form a gate stack 152' including a gate dielectric layer 132 and a gate electrode 142'. The gate stack 152', the gate dielectric layer 132 and the gate electrode 142' may respectively be configured as a low-voltage gate stack 152', a low-voltage gate dielectric layer 132 and a low-voltage gate electrode 142'.

In some embodiments, the gate electrode 142' includes polysilicon. The gate dielectric layer 132 may include a high-k gate dielectric layer. The remaining portion of the altered supporting layer 702' is concurrently patterned to form discrete portions 163 and 164 respectively overlying the gate electrodes 143 and 144 and the gate dielectric layers 133 and 134. The portions 163 and 164 each include a masking layer 163a/164a and a polysilicon liner 163b/164b. The portions 163 and 164 may respectively be hereinafter referred to as gate masking structures 163 and 164.

Alternatively or additionally, a gate stack 762 similar to the gate stack 152' is formed in the boundary region 105. For example, the gate stack 762 also includes a gate dielectric layer 762a and a gate electrode 762b. Alternatively or additionally, a gate masking structure 764 similar to the gate masking structure 163 (or 164) is formed in the boundary region 105. For example, the gate masking structure 764 also includes a masking layer 764a and a polysilicon liner 764b. In some embodiments, a width W5 of the gate stack 762 is substantially equal to a width W6 of the gate masking structure 764. In some embodiments, the width W5 is substantially equal to 0.175 μm or in a range of about 0.1 μm to about 0.3 μm.

The sealing layer 740, the filling layer 750, the gate stack 762 and the gate masking structure 764 may collectively be hereinafter referred to as an altered boundary precursor 760'. A width W7 of the altered boundary precursor 760' is selected such that the altered boundary precursor 760' provides the structural support during the subsequent fabrication. The width W7 of the altered boundary precursor 760' may be less than or substantially equal to the width of the isolation structure 114. In some embodiments, the width W7 is in a range of about 700 nm to about 1000 nm.

Figure 24:
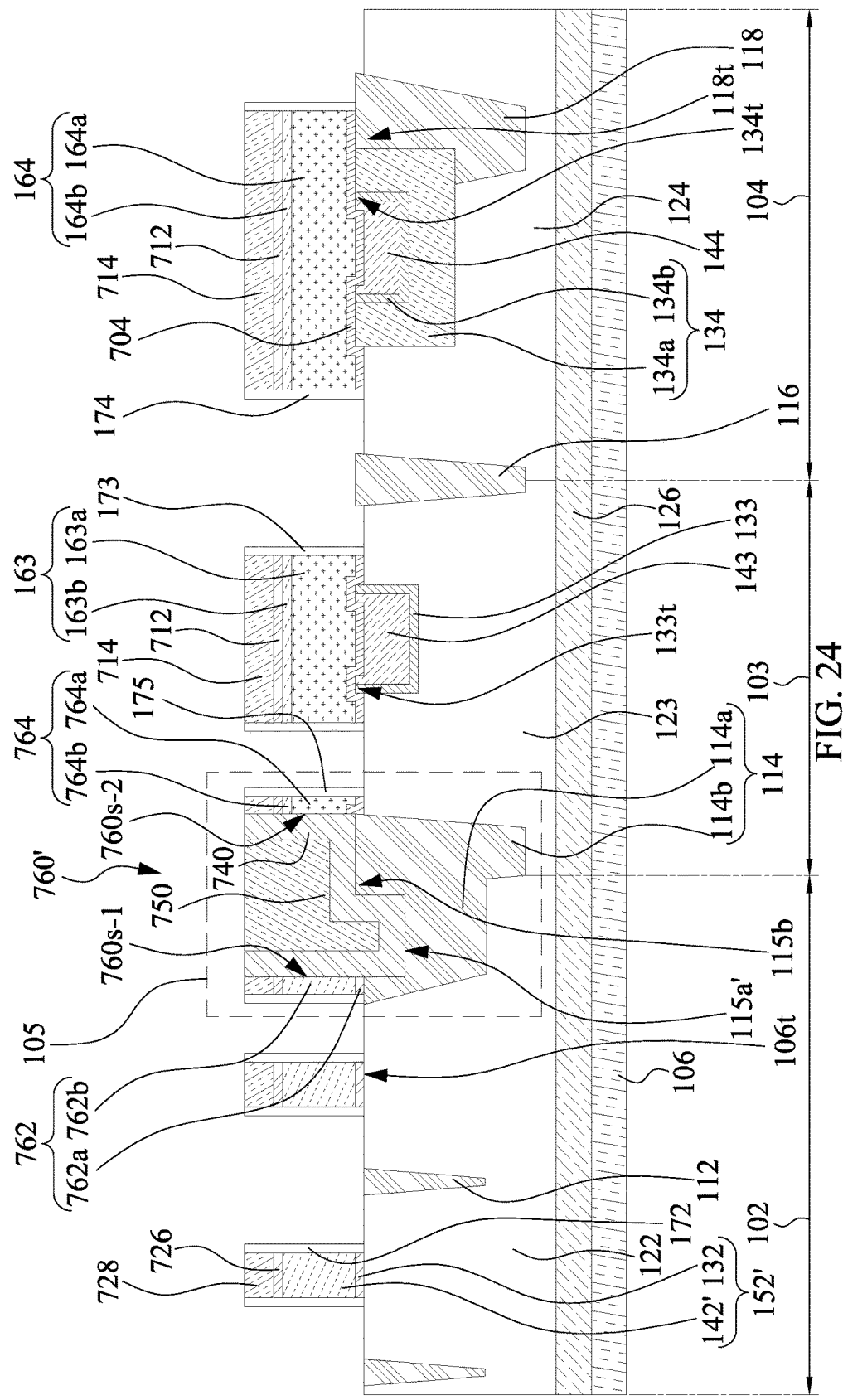

Referring to FIG. 24, in some embodiments, spacers 172, 173, 174 and 175 are formed on sidewalls of the gate stack 152', the gate masking structures 163 and 164, and the altered boundary precursor 760', respectively. In some embodiments, each of the spacers 172, 173, 174 and 175 includes a silicon nitride layer. In alternative embodiments, each of the spacers 172, 173, 174 and 175 includes a silicon oxide layer and a silicon nitride layer on the silicon oxide layer. The formation of the spacers 172, 173, 174 and 175 may include depositing blanket dielectric layers, and then performing an anisotropic etching to remove horizontal portions of the blanket dielectric layers. Available deposition methods include plasma-enhanced chemical vapor deposition (PECVD), low-pressure chemical vapor deposition (LPCVD), sub-atmospheric chemical vapor deposition (SACVD), and other deposition methods.

Figure 25:
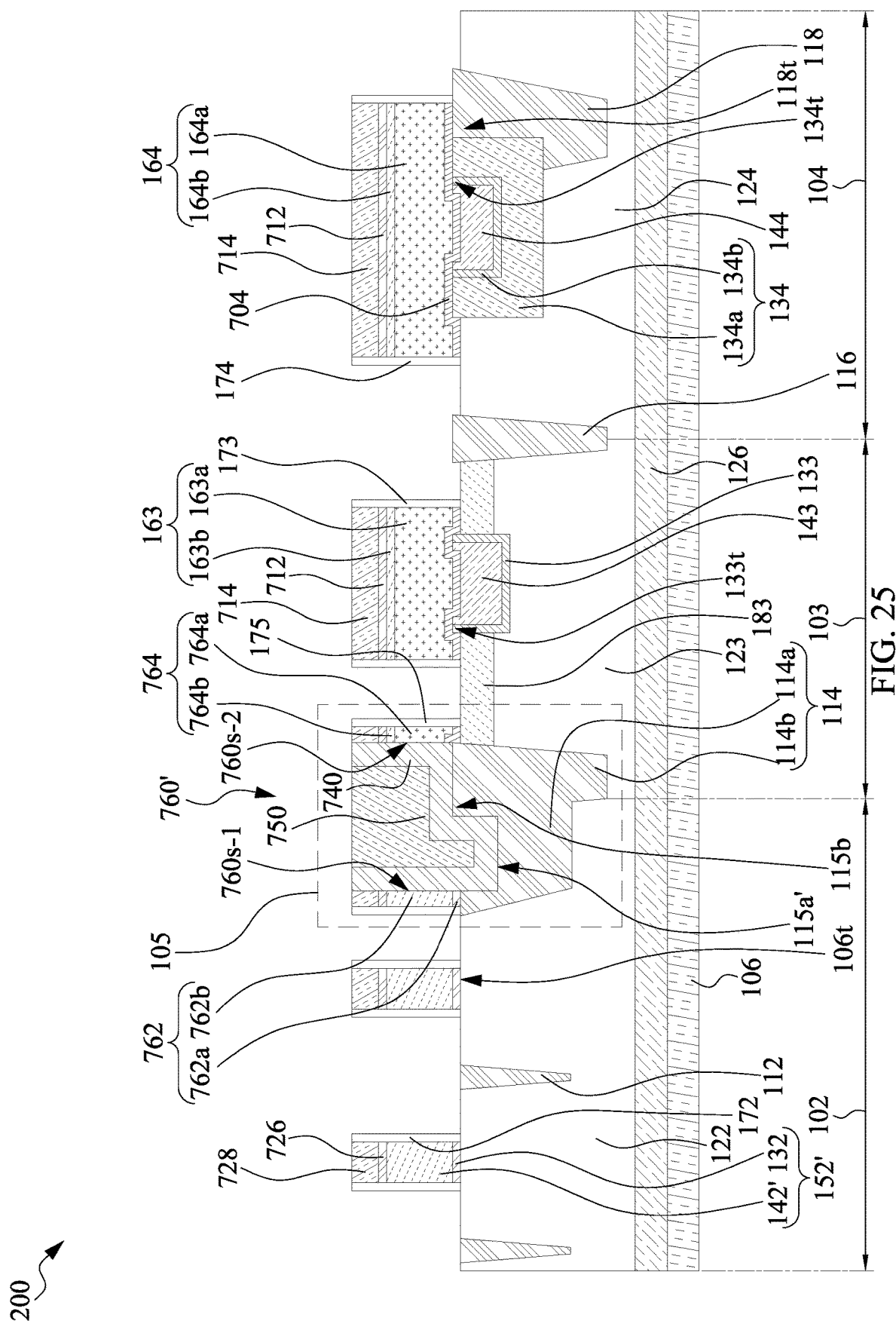

Referring to FIG. 25, in some embodiments, one or more shallow doped regions 183 are formed in the second region 103. In some embodiments, the doped region 123 is a p-type region, and the shallow doped regions 183 are n-type regions. In alternative embodiments, the doped region 123 is an n-type region, and the shallow doped regions 183 are p-type regions. In some alternative embodiments, one or more shallow doped regions (not shown) are also formed in the third region 104. In alternative embodiments, the formation of the shallow doped regions 183 is performed immediately after the formation of the doped region 123. In such embodiments, the implantation processes for forming the doped region 123 and the shallow doped regions 183 may be arranged in any order.

Figure 26:
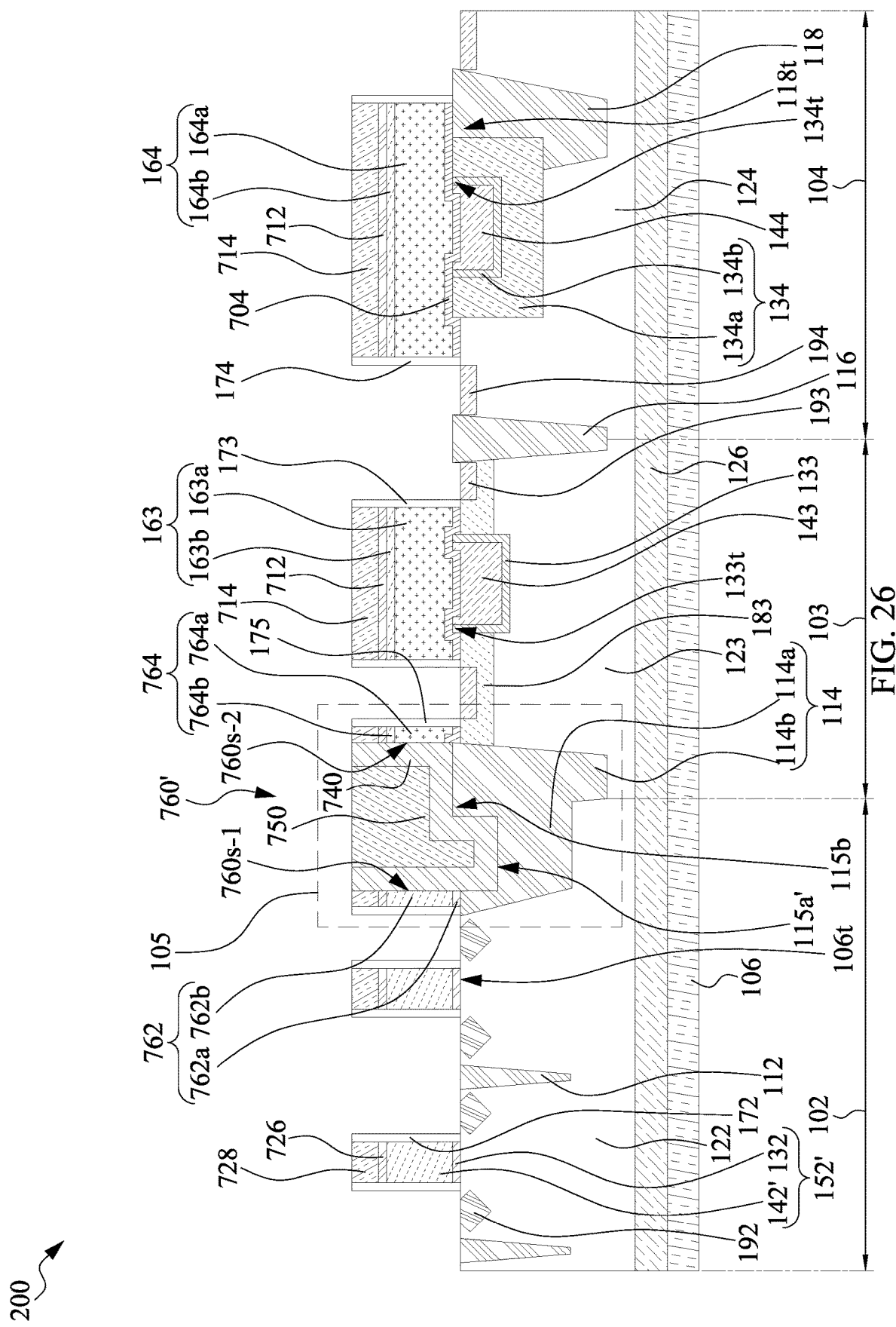

Referring to FIG. 26, in some embodiments, a pair of source/drain structures 192 may be formed in the substrate 106 on opposite sides of the gate stack 152'. The source/drain structures 192 may be strained source/drain (S/D) structures. In some embodiments, the source/drain structures 192 are formed by growing a strained material by an epitaxial (epi) operation. In some embodiments, a lattice constant of the strained material may be different from a lattice constant of the substrate 106. In alternative embodiments, the source/drain structures 192 are formed by epitaxial growth followed by an implantation process. The implantation process may introduce suitable dopants into the source/drain structures 192. Configurations of the source/drain structures 192 depend on different epitaxial techniques, and are not limited herein. In some embodiments, the source/drain structures 192 include Ge, SiGe, InAs, InGaAs, InSb, GaSb, InAlP, InP, or a combination thereof.

In some embodiments, a pair of source/drain regions 193 may be formed in the substrate 106 on opposite sides of the gate masking structure 163. Additionally, a pair of source/drain regions 194 may be formed in the substrate 106 on opposite sides of the gate masking structure 164. In some embodiments, the source/drain regions 193 and 194 may be formed in a single formation process. The source/drain regions 193 and 194 may be formed simultaneously in a single implantation process. In some embodiments, the source/drain regions 193 and 194 are heavily doped. In some embodiments, a photoresist (not shown) is formed over the substrate 106 to define locations of the source/drain regions 193 and 194. The source/drain regions 193 and 194 may have edges aligned with edges of the spacers 173 and 174, respectively. In alternative embodiments, the source/drain regions 193 and 194 may respectively be formed immediately after the formation of the doped regions 123 and 124. The source/drain regions 194 may be asymmetrical with respect to the gate electrode 144.

Figure 27:
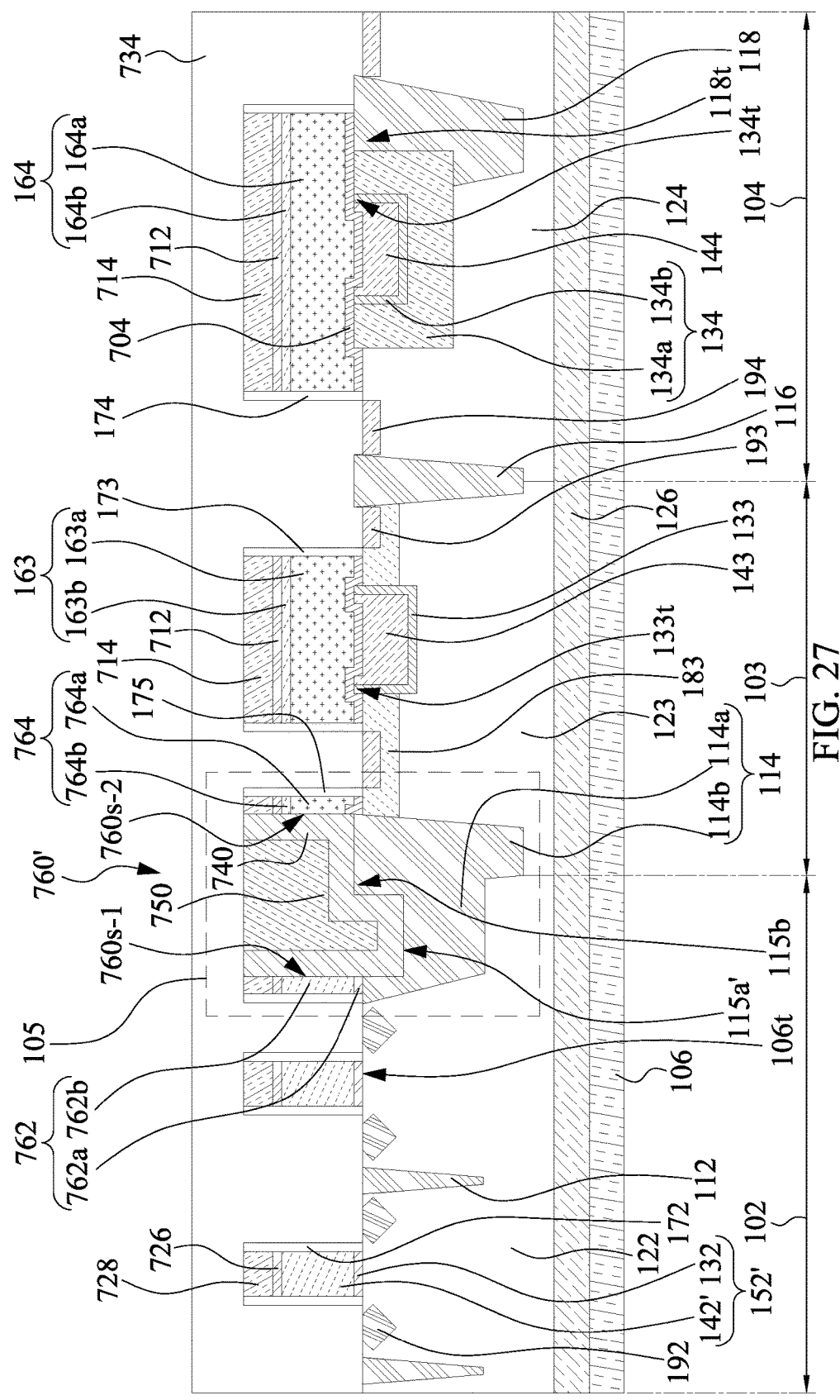

Referring to FIG. 27, in some embodiments, a filling layer 734 is formed over the gate stack 152' in the first region 102, the altered boundary precursor 760' in the boundary region 105, the gate masking structure 163 in the second region 103 and the gate masking structure 164 in the third region 104. In some embodiments, the filling layer 734 (e.g., a filling layer made of a photoresist material) may be formed by coating or spin coating to form a planar upper surface. In some embodiments, the filling layer 734 is then patterned to form openings exposing the gate stack 152' in the first region 102, the altered boundary precursor 760' in the boundary region 105, the gate masking structure 163 in the second region 103 and the gate masking structure 164 in the third region 104 such that the hard mask layers 712, 714, 726 and 728 may be removed in a subsequent process.

Figure 28:
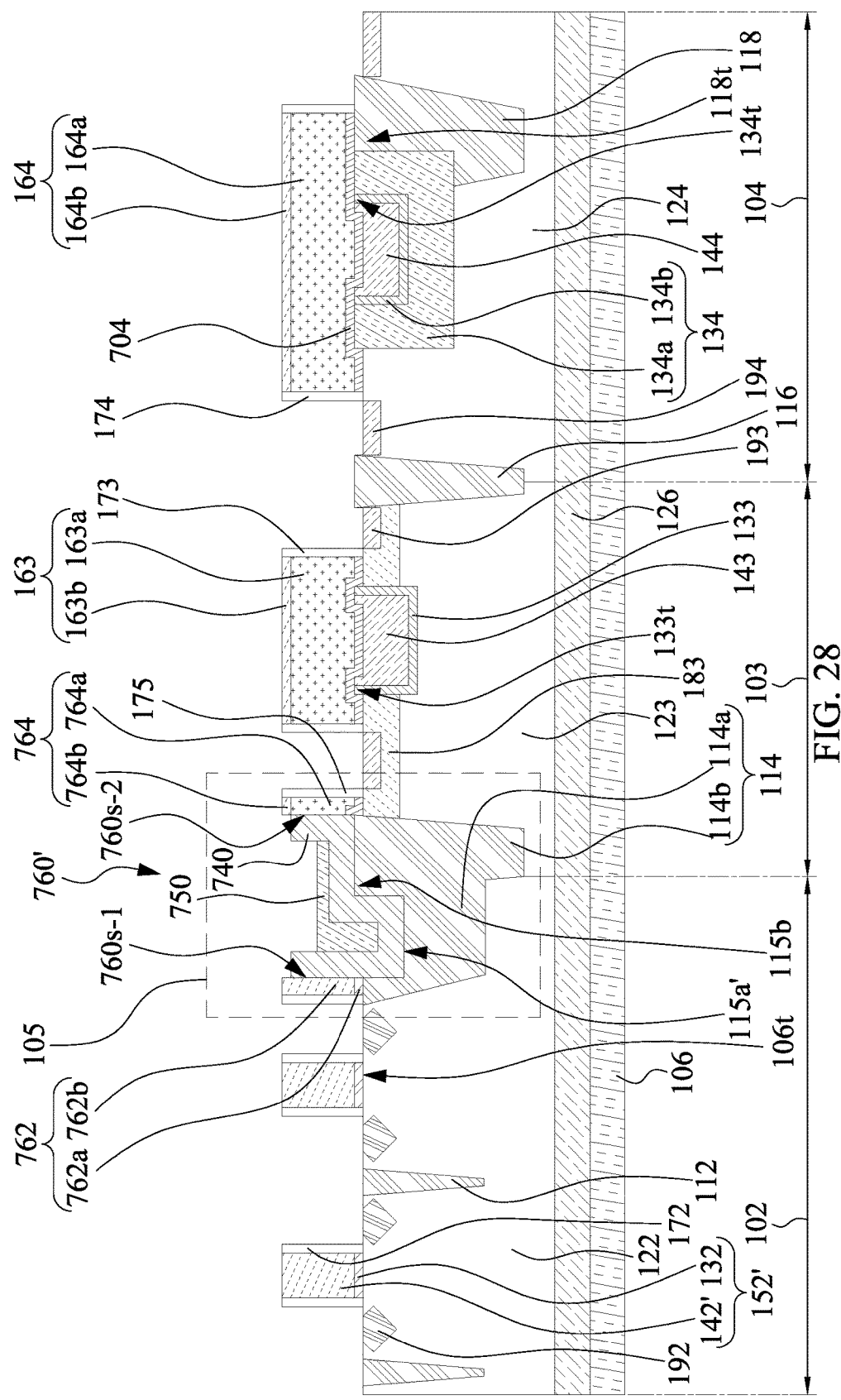

Referring to FIG. 28, in some embodiments, the hard mask layers 712, 714, 726 and 728 are removed. An etching process may be performed to remove the hard mask layers 712, 714, 726 and 728. In some embodiments, the etching process further removes a portion of the filling layer 750. In some embodiments, an etch rate of the filling layer 750 is greater than an etch rate of the sealing layer 740. Additionally, the etch rate of the sealing layer 740 may be greater than an etch rate of the gate electrode 762*b* or an etch rate of the polysilicon liner 764*b*. Accordingly, a height of the filling layer 750 may be significantly reduced, while a height of the sealing layer 740 is moderately reduced. Furthermore, a height of the gate electrode 762*b* or a height of the polysilicon liner 764*b* may be slightly reduced.

In some embodiments, the gate electrode 142' in the first region 102, the gate electrode 762*b* and the polysilicon liner 764*b* in the boundary region 105, the polysilicon liner 163*b* in the second region 103, and the polysilicon liner 164*b* in the third region 104 are respectively configured as an etch stop layer during the etching process. An upper surface of the polysilicon liner 764*b* may be aligned with an upper surface of the polysilicon liners 163*b*/164*b*. Additionally, an upper surface of the gate electrode 762*b* may be aligned with an upper surface of the gate electrode 142'. In some embodiments, the upper surface of the gate electrode 762*b* is higher than the upper surface of the polysilicon liner 764*b*. In alternative embodiments, the upper surface of the gate electrode 762*b* is aligned with (or substantially coplanar with) the upper surface of the polysilicon liner 764*b*.

Figure 29:
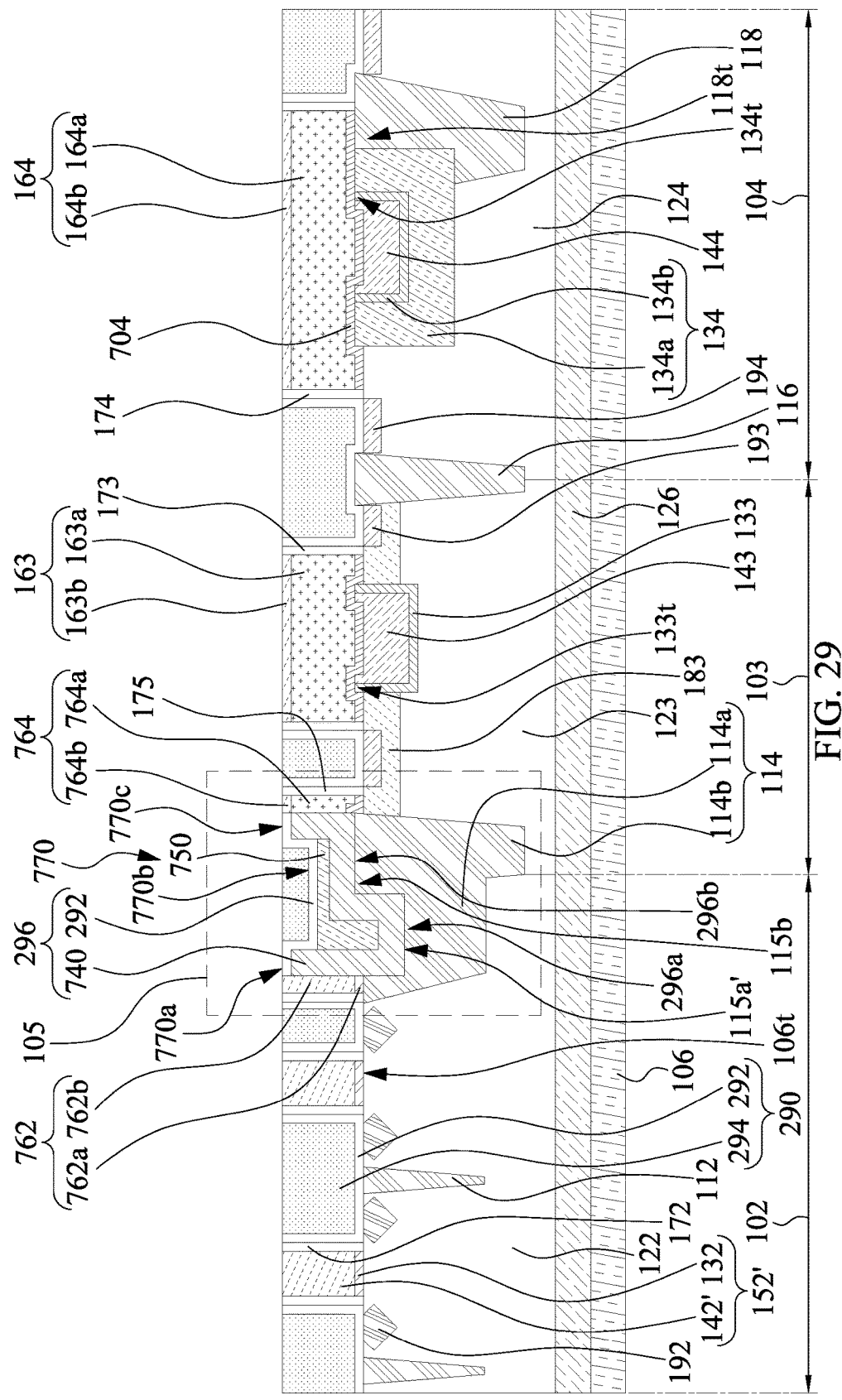

Referring to FIG. 29, in some embodiments, a dielectric layer 290 is formed over the substrate 106. The dielectric layer 290 is formed surrounding the gate stack 152' and the gate masking structures 163 and 164. In some embodiments, the dielectric layer 290 may include an etch-stop layer (e.g., a contact etch stop layer (CESL)) 292 and various dielectric layers (e.g., an inter-layer dielectric (ILD) layer 294) formed over the substrate 106. In some embodiments, the CESL 292 includes a SiN layer, a SiCN layer, a SiON layer, and/or other suitable materials. In some embodiments, the ILD layer 294 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after the CESL 292 and the ILD layer 294 are deposited, a planarization process may be performed to form the dielectric layer 290.

After the planarization process, the polysilicon liners 163*b*, 164*b* and 764*b* are exposed. Additionally, the gate electrodes 142' and 762*b* are also exposed. In some embodiments, an upper surface of the dielectric layer 290 is aligned with the upper surfaces of the gate electrodes 142' and 762*b*. Additionally, the upper surface of the dielectric layer 290 is aligned with the upper surfaces of the polysilicon liners 163*b*, 164*b* and 764*b*. In some alternative embodiments, the masking layers 163*a* and 164*a* may be exposed after the planarization process.

In some embodiments, the CESL 292 is conformally formed to cover an exposed surface and sidewalls of the sealing layer 740 and an exposed surface of the filling layer 750. In some embodiments, the material of the CESL 292 is selected from the same candidate materials as the sealing layer 740. The CESL 292 and the sealing layer 740 may include a same material. The CESL 292 may be coupled to the sealing layer 740. Accordingly, the CESL 292 and the sealing layer 740 may collectively be referred to as a first boundary dielectric layer 296. The filling layer 750 may be referred to as a second boundary dielectric layer.

In some embodiments, the first boundary dielectric layer 296 is substantially conformal with respect to the stepped profile of the isolation structure 114. The first boundary dielectric layer 296 may include a planar surface 296a closer to the first region 102 and a planar surface 296b closer to the second region 103. In some embodiments, the planar surface 296a is located at a position lower than the planar surface 296b. Additionally, the planar surface 296a is lower than the upper surface 106t of the substrate 106. In some embodiments, an upper surface of the first boundary dielectric layer 296 is aligned with the upper surfaces of the gate electrodes 142' and 762b, and/or the upper surfaces of the polysilicon liners 163b, 164b and 764b. In some embodiments, a bottom of the second boundary dielectric layer (i.e., 750) is lower than or substantially coplanar with the upper surface 106t of the substrate 106. In some embodiments, the second boundary dielectric layer (i.e., 750) is surrounded by the first boundary dielectric layer 296.

The gate electrode 762b may be referred to as a first boundary conductive layer, and the polysilicon liner 764b may be referred to as a second boundary conductive layer. In some embodiments, a dimension of the first boundary conductive layer (i.e., 762b) is different from a dimension of the second boundary conductive layer (i.e., 764b). The height of the first boundary conductive layer (i.e., 762b) may be greater than the height of the second boundary conductive layer (i.e., 764b).

The sealing layer 740, the filling layer 750, the CESL 292, the gate stack 762, the gate masking structure 764 and the spacers 175 may collectively be hereinafter referred to as a boundary structure 770. The boundary structure 770 may include a first nitride component (i.e., the sealing layer 740 and the CESL 292), a second nitride component (i.e., the masking layer 764a), an oxide component (i.e., the filling layer 750), a first polysilicon component (i.e., the gate electrode 762b), a second polysilicon component (i.e., the polysilicon liner 764b), and a high-k dielectric component (i.e., the gate dielectric layer 762a).

In some embodiments, the oxide component (i.e., 750) is surrounded by the first nitride component (i.e., 740/292). The first polysilicon component (i.e., 762b) and the second polysilicon component (i.e., 764b) are disposed alongside the first nitride component (i.e., 740/292). The first polysilicon component (i.e., 762b) is located close to the first region 102. The second polysilicon component (i.e., 764b) is located close to the second region 103 (or the third region 104). The high-k dielectric component (i.e., 762a) is disposed between the first polysilicon component (i.e., 762b) and the substrate 106.

The first nitride component (i.e., 740/292) includes an upper surface 770a closer to the first polysilicon component (i.e., 762b) and an upper surface 770b distal to the first polysilicon component (i.e., 762b). In some embodiments, the upper surface 770b is lower than the upper surface 770a. In some embodiments, the upper surface 770a is coplanar with an upper surface of the first polysilicon component (i.e., 762b). The first nitride component (i.e., 740/292) further includes an upper surface 770c closer to the second polysilicon component (i.e., 764b). In some embodiments, the upper surface 770c is aligned with (or substantially coplanar with) the upper surface 770a.

The proposed boundary structure provides advantages. In some embodiments where the boundary structure is absent, a dishing effect may be introduced by planarization processes. Hence, a boundary region may have uneven surfaces, which could lead to device performance degradation in a low-voltage region, a medium-voltage region and/or a high-voltage region. By forming the boundary structure 770 within the boundary region 105 as introduced above, residue contamination and isolation damage due to the gate dielectric's patterning and removal may be reduced or eliminated since portions of the low-voltage precursor layers are formed on the tilted sidewall of the supporting layers and thus completely removed during a subsequent etching process. In addition, the disclosed boundary structure 770 provides structural support during fabrication processes, such that the dishing effect is reduced or eliminated. Performance of the device may thereby be improved.

Figure 30:
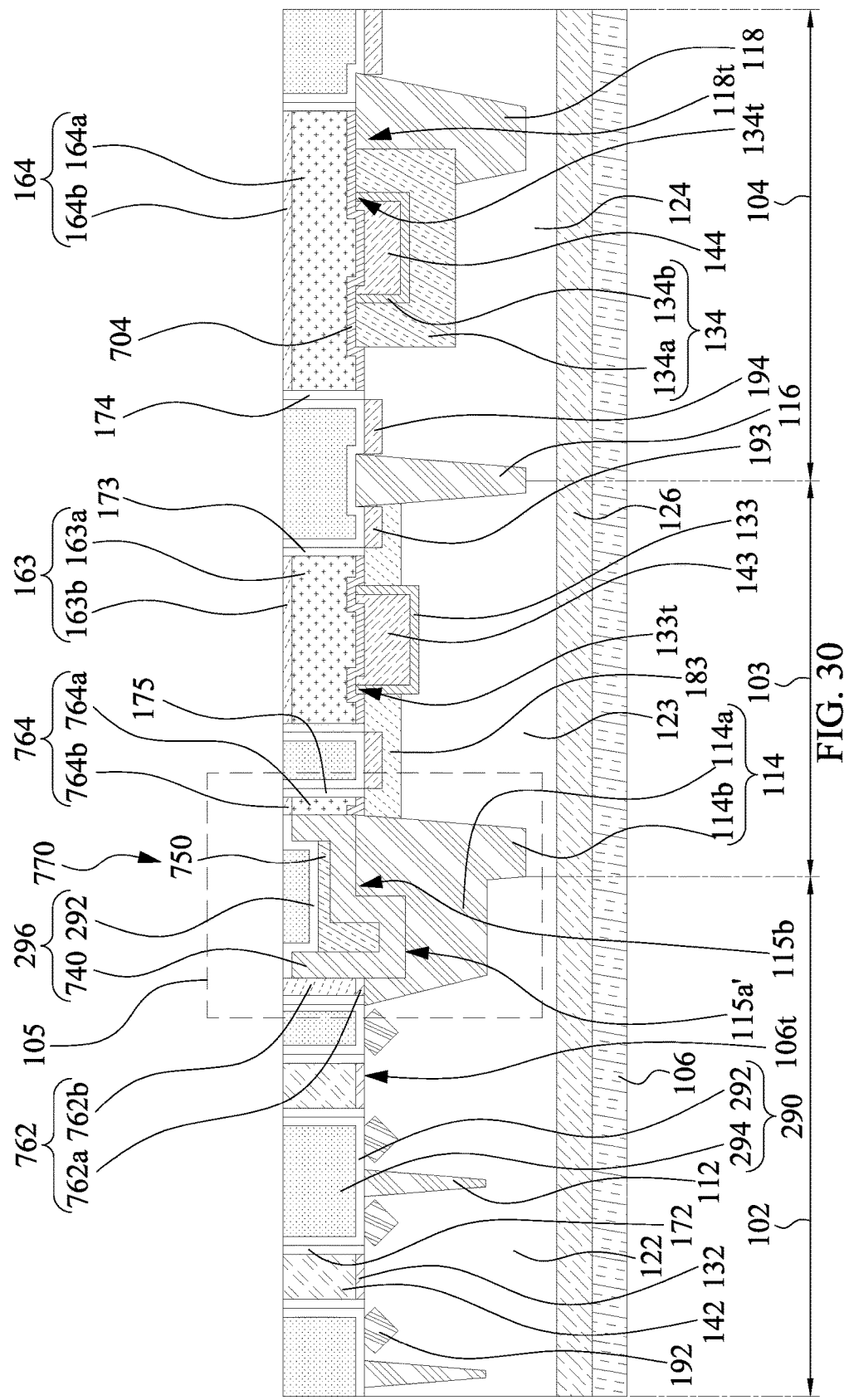

Referring to FIG. 30, in some embodiments, a replacement gate process may be subsequently performed by replacing the gate electrode 142' with metal materials to form a gate electrode 142. A series of deposition and etching processes may be performed to form different metal compositions for different devices or different components of the same devices, in order to achieve desired work functions. In some embodiments, the gate electrode 142 may be made of metal or a metal alloy. In some embodiments, the gate electrode 142 may include a core metal layer such as copper (Cu), tungsten (W), aluminum (Al), or an alloy thereof, and a barrier layer such as titanium (Ti), tantalum (Ta), zirconium (Zr), or an alloy thereof. The gate electrode 142 may be configured as a low-voltage gate electrode 142. In some alternative embodiments, another gate dielectric layer may be formed to cover bottom and sidewall surfaces of the gate electrode 142. In such embodiments, the gate dielectric layer includes a high-k dielectric material with a dielectric constant greater than 3.9. Examples of the gate dielectric layer include hafnium oxide (HfO), hafnium silicon oxide (HfSiO), hafnium aluminum oxide (HfAlO), and hafnium tantalum oxide (HfTaO).

Figure 31:
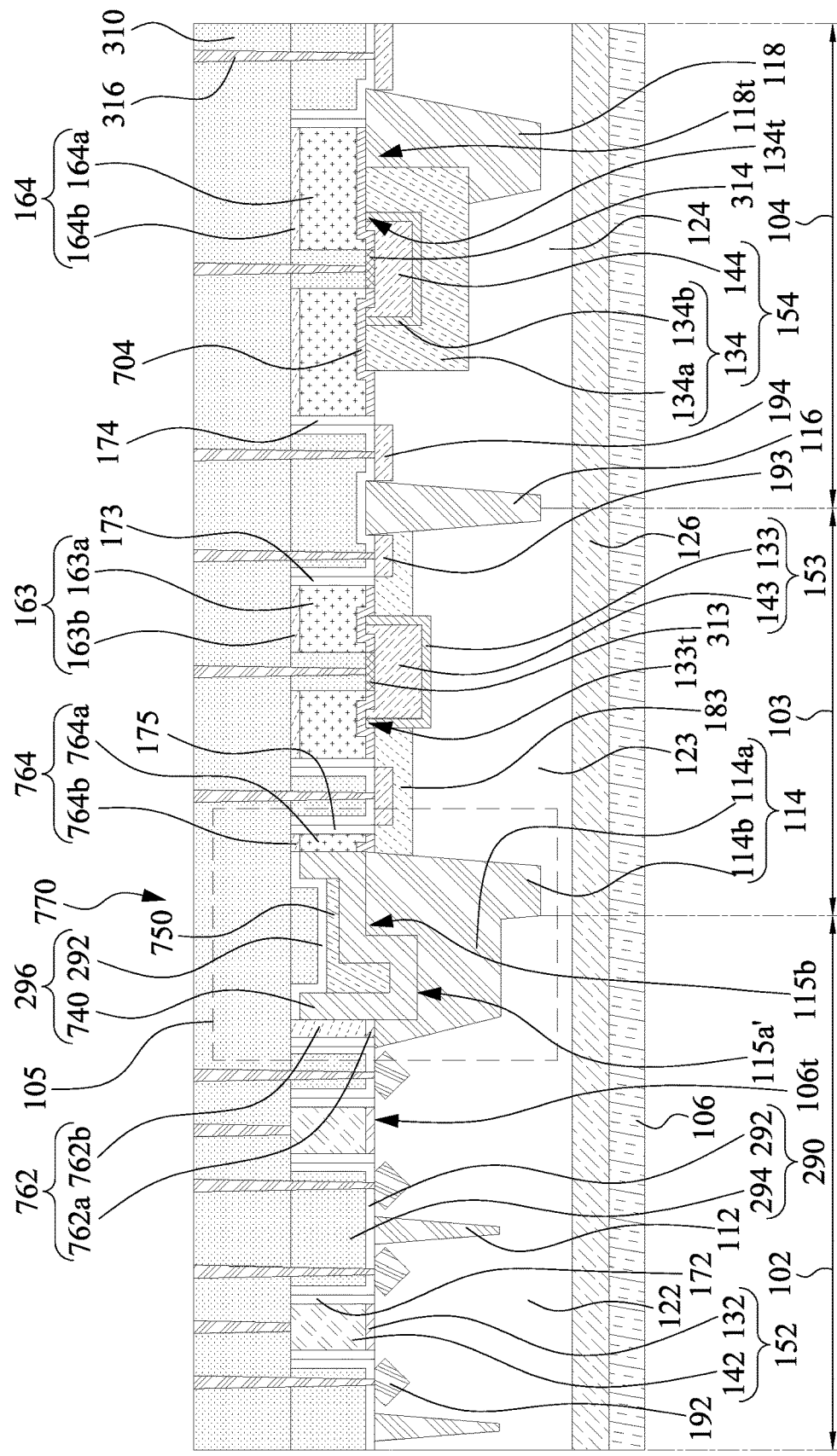

Referring to FIG. 31, in some embodiments, a dielectric layer 310 is formed over the dielectric layer 290. The ILD layer 294 and the dielectric layer 310 may include same or different low-k dielectric layers, ultra-low-k dielectric layers, extreme low-k dielectric layers, and/or silicon dioxide layers. In some embodiments, the gate masking structures 163 and 164 may be patterned prior to the forming of the dielectric layer 310 to form openings exposing the gate electrode 143 and the gate electrode 144. Silicide layers 313 and 314 may respectively be formed on exposed surfaces of the gate electrode 143 and the gate electrode 144. The dielectric layer 310 may also fill the openings previously formed and may cover the gate electrode 143 and the gate electrode 144.

In some embodiments, after the silicide layer 313 is formed, the gate masking structure 163 is disposed over the substrate 106 at a peripheral region of the gate electrode 143. Additionally, the gate masking structure 164 is disposed over the substrate 106 at a peripheral region of the gate electrode 144, after the silicide layer 314 is formed.

In some embodiments, contacting structures 316 are formed through the dielectric layer 310 reaching upper surfaces of the gate electrode 142, the gate electrode 143 and the gate electrode 144. Alternatively or additionally, the contacting structures 316 may extend through the dielectric layers 290 and 310 and may be coupled to the source/drain structures 192 and the source/drain regions 193 and 194. The contacting structures 316 may be formed by selectively etching the dielectric layer 310 and/or the dielectric layer 290 to form openings (e.g., with a patterned photoresist mask in place), and by subsequently depositing a conductive material within the openings. In some embodiments, the conductive material may include tungsten (W), copper (Cu), aluminum (Al) or titanium nitride (TiN), for example.

Different transistor devices in different regions are thus formed. A transistor device 152 including the gate dielectric layer 132 and the gate electrode 142 is disposed in the first region 102. A transistor device 153 including the gate dielectric layer 133 and the gate electrode 143 is disposed in the second region 103. A transistor device 154 including the gate dielectric layer 134 and the gate electrode 144 is disposed in the third region 104.

In some embodiments, the transistor device 153 may have structures similar to those of the transistor device 154 but with smaller dimensions. In some embodiments, the gate electrode 144 and the gate electrode 143 include polysilicon. In some other embodiments, the gate electrode 144 and the gate electrode 143 may be made of metal or a metal alloy.

The transistor device 154 is configured to operate at an operation voltage greater than that of the transistor device 153. Additionally, the transistor device 153 is configured to operate at an operation voltage greater than that of the transistor device 152. The gate electrode 144 may have a gate length and a gate width greater than those of the gate electrode 143 or the gate electrode 142. The gate electrode 143 may have a gate length and a gate width greater than those of the gate electrode 142. The gate electrode 144 and the gate electrode 143 may be recessed in the substrate 106. The gate dielectric layer 134 may have a thickness greater than that of the gate dielectric layer 133 or the gate dielectric layer 132. In some embodiments, the thickness of the gate dielectric layer 134 is about 2 to 5 times of a thickness of the gate dielectric layer 132, such that the gate dielectric layer 134 may support a greater breakdown voltage. For example, the gate dielectric layer 132 may have a thickness in a range from about 30 angstroms (Å) to about 100 Å, while the gate dielectric layer 134 may have a thickness in a range from about 150 Å to about 400 Å.

The transistor device 154 may be used to drive memory cells, and may have a relatively high operating voltage level (e.g., greater than 10V). The transistor device 153 may be, for example, an RF (radio frequency) device or a MIM (metal-insulator-metal) device, and may have an operating voltage level around 6 to 10V. The transistor device 152 may be a core device with an operating voltage level less than 1.5V or around 0.7 to 1.1V, a word line device with an operating voltage level around 1V to 2V, or an I/O (input and output) device with an operating voltage level around 1.5V to 3V.

The present disclosure provides embodiments of a boundary structure and forming method thereof that provide one or more improvements over existing approaches. By forming the boundary structure within the boundary region as introduced above, residue contamination and isolation damage may be reduced. In addition, the disclosed boundary structure provides structural support during fabrication processes, such that a dishing effect is reduced or eliminated. Device performance may thereby be improved.

In accordance with some embodiments of the present disclosure, a semiconductor structure is provided. The semiconductor structure includes a substrate. The substrate includes a first region, a second region, and a boundary region defined between the first region and the second region. An isolation structure is disposed in the boundary region. An upper surface of the isolation structure has a stepped profile. A first boundary dielectric layer and a second boundary dielectric layer are disposed over the isolation structure. The first boundary dielectric layer is substantially conformal with respect to the stepped profile of the isolation structure.

In accordance with some embodiments of the present disclosure, a semiconductor structure is provided. The semiconductor structure includes a substrate. The substrate includes a low-voltage region, a high-voltage region, and a boundary region defined between the low-voltage region and the high-voltage region. An isolation structure is disposed in the boundary region. The isolation structure includes a first planar upper surface closer to the low-voltage region and a second planar upper surface closer to the high-voltage region. The first planar upper surface is located at a position lower than an upper surface of the substrate. A boundary structure is disposed over the isolation structure. The boundary structure is substantially conformal with respect to a profile of the isolation structure. The boundary structure includes an oxide component, a nitride component surrounding the oxide component, and a first polysilicon component alongside the nitride component.

In accordance with some embodiments of the present disclosure, a method of forming a semiconductor structure is provided. The method includes the following operations. A substrate is provided. The substrate has a low-voltage region, a high-voltage region, and a boundary region defined between the low-voltage region and the high-voltage region. The substrate includes an isolation structure disposed in the boundary region. A supporting layer is formed over the substrate in the high-voltage region. The supporting layer has a slanted sidewall in the boundary region that is tilted from bottom to top toward the high-voltage region. A first portion of the isolation structure is covered by the supporting layer and a second portion of the isolation structure is free of the supporting layer. The supporting layer and the second portion of the isolation structure are removed. A boundary structure is formed in the boundary region. The boundary structure is substantially conformal with respect to a profile of the isolation structure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate comprising a first region, a second region, and a boundary region defined between the first region and the second region;
a first transistor device disposed within the first region and having a first gate electrode disposed over a first gate dielectric layer;
a second transistor device disposed within the second region and having a second gate electrode disposed over a second gate dielectric layer;

a gate masking structure disposed over the second gate electrode;

an isolation structure disposed in the boundary region, wherein an upper surface of the isolation structure has a stepped profile; and a first boundary dielectric layer and a second boundary dielectric layer disposed over the isolation structure, wherein the first boundary dielectric layer is substantially conformal with respect to the stepped profile of the isolation structure, wherein the gate masking structure has an upper surface substantially coplanar with an upper surface of the first boundary dielectric layer.

2. The semiconductor structure of claim 1, wherein the second boundary dielectric layer is surrounded by the first boundary dielectric layer.

3. The semiconductor structure of claim 1, wherein a bottom of the second boundary dielectric layer is lower than or substantially coplanar with an upper surface of the substrate.

4. The semiconductor structure of claim 1, wherein the first boundary dielectric layer includes a first planar surface closer to the first region and a second planar surface closer to the second region, wherein the first planar surface is located at a position lower than the second planar surface.

5. The semiconductor structure of claim 4, wherein the first planar surface is lower than an upper surface of the substrate.

6. The semiconductor structure of claim 1,
wherein the second transistor device is configured to operate at an operation voltage greater than that of the first transistor device.

7. The semiconductor structure of claim 1, wherein the second gate electrode is recessed in the substrate.

8. The semiconductor structure of claim 1, wherein the first gate electrode has an upper surface substantially coplanar with the upper surface of the first boundary dielectric layer.

9. The semiconductor structure of claim 1, further comprising:
a first boundary conductive layer and a second boundary conductive layer on opposite sides of the first boundary dielectric layer, wherein a dimension of the first boundary conductive layer is different from a dimension of the second boundary conductive layer.

10. The semiconductor structure of claim 1, wherein the first boundary dielectric layer and the second boundary dielectric layer comprises different dielectric materials.

11. The semiconductor structure of claim 1, wherein a thickness of the first gate dielectric layer is less than a thickness of the second gate dielectric layer.

12. A semiconductor structure, comprising:
a substrate comprising a low-voltage region, a high-voltage region, and a boundary region defined between the low-voltage region and the high-voltage region;
an isolation structure disposed in the boundary region, wherein the isolation structure includes a first planar upper surface closer to the low-voltage region and a second planar upper surface closer to the high-voltage region, wherein the first planar upper surface is located at a position lower than an upper surface of the substrate; and
a boundary structure disposed over the isolation structure, wherein the boundary structure is substantially conformal with respect to a profile of the isolation structure, and the boundary structure includes:
an oxide component;
a nitride component surrounding the oxide component;
a first polysilicon component alongside the nitride component; and
a high-k dielectric component disposed between the first polysilicon component and the substrate.

13. The semiconductor structure of claim 12, wherein the first polysilicon component is located close to the low-voltage region.

14. The semiconductor structure of claim 12, wherein the boundary structure further includes a second polysilicon component alongside the nitride component, and the second polysilicon component is located close to the high-voltage region.

15. The semiconductor structure of claim 12, wherein the nitride component includes a first upper surface closer to the first polysilicon component and a second upper surface distal to the first polysilicon component, and the second upper surface is lower than the first upper surface.

16. The semiconductor structure of claim 15, wherein an upper surface of the first polysilicon component is aligned with the first upper surface.

17. A method of forming a semiconductor structure, comprising:
providing a substrate having a low-voltage region, a high-voltage region, and a boundary region defined between the low-voltage region and the high-voltage region, the substrate comprising an isolation structure disposed in the boundary region;
forming a supporting layer over the substrate in the high-voltage region, wherein the supporting layer has a slanted sidewall in the boundary region that is tilted from bottom to top toward the high-voltage region, a first portion of the isolation structure is covered by the supporting layer, and a second portion of the isolation structure is free of the supporting layer;
removing the supporting layer and the second portion of the isolation structure; and
forming a boundary structure in the boundary region, wherein a bottom of the boundary structure is substantially conformal with respect to a profile of the isolation structure.

18. The method of claim 17, wherein the bottom of the boundary structure is lower than an upper surface of the substrate.

19. The method of claim 17, wherein the forming of the boundary structure further includes:
forming a first nitride layer over the substrate, wherein the first nitride layer is substantially conformal with respect to the profile of the isolation structure;
forming an oxide layer over the first nitride layer; and
forming a second nitride layer over the oxide layer, wherein the second nitride layer is coupled to the first nitride layer.

20. The method of claim 17, wherein the removal of the second portion of the isolation structure forms a first planar upper surface closer to the low-voltage region and a second planar upper surface closer to the high-voltage region, wherein the first planar upper surface is located at a position lower than an upper surface of the substrate.

* * * * *